US009269991B2

(12) United States Patent
Takeshita

(10) Patent No.: US 9,269,991 B2
(45) Date of Patent: Feb. 23, 2016

(54) BATTERY MONITORING SYSTEM AND BATTERY MONITORING DEVICE

(71) Applicant: LAPIS Semiconductor Co., Ltd., Kanagawa (JP)

(72) Inventor: Koji Takeshita, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 233 days.

(21) Appl. No.: 14/150,301

(22) Filed: Jan. 8, 2014

(65) Prior Publication Data

US 2014/0191765 A1 Jul. 10, 2014

(30) Foreign Application Priority Data

Jan. 10, 2013 (JP) ................. 2013-002651

(51) Int. Cl.

| H01M 10/46 | (2006.01) |
|---|---|
| H01M 10/42 | (2006.01) |
| H01M 10/48 | (2006.01) |
| H02J 7/00 | (2006.01) |
| B60L 3/12 | (2006.01) |
| B60L 11/18 | (2006.01) |
| G01R 31/36 | (2006.01) |

(52) U.S. Cl.
CPC .............. *H01M 10/4207* (2013.01); *B60L 3/12* (2013.01); *B60L 11/1853* (2013.01); *G01R 31/3658* (2013.01); *H01M 10/482* (2013.01); *H02J 7/0021* (2013.01); *B60L 2240/547* (2013.01); *G01R 31/362* (2013.01)

(58) Field of Classification Search
CPC ..... H02J 7/1423; H02J 7/0013; H02J 7/0019; H02J 7/0026; H02J 7/0021

USPC .......... 320/107, 116, 118, 119, 132; 324/425, 324/426, 433, 434
See application file for complete search history.

(56) References Cited

U.S. PATENT DOCUMENTS

| 2010/0209748 A1* | 8/2010 | Kudo | H01M 10/425 429/91 |
|---|---|---|---|
| 2011/0254508 A1* | 10/2011 | Sakakibara | H01M 10/441 320/118 |
| 2011/0316520 A1* | 12/2011 | Kawahara | B60L 3/0046 323/351 |

FOREIGN PATENT DOCUMENTS

| JP | H08-140204 A | 5/1996 |
|---|---|---|
| JP | 2006-180486 A | 7/2006 |

* cited by examiner

*Primary Examiner* — Edward Tso
(74) *Attorney, Agent, or Firm* — Rabin & Berdo, P.C.

(57) ABSTRACT

A battery monitoring system includes: plural battery monitoring devices that are serially connected to each other; and a control circuit connected to one battery monitoring device and that transmits a first activation signal to the one battery monitoring device, wherein each particular one of the plural battery monitoring devices includes: a constant voltage generation circuit that generates and outputs a constant voltage; a first activation circuit that outputs a second activation signal if the first activation circuit receives the first activation signal; and a second activation circuit that outputs a third activation signal in response to recognizing the constant voltage generated by the constant voltage generation of another of the battery monitoring devices that is connected to the particular battery monitoring device, and wherein the constant voltage generation circuit generates the constant voltage if the constant voltage generation circuit receives the second activation signal or the third activation signal.

7 Claims, 19 Drawing Sheets

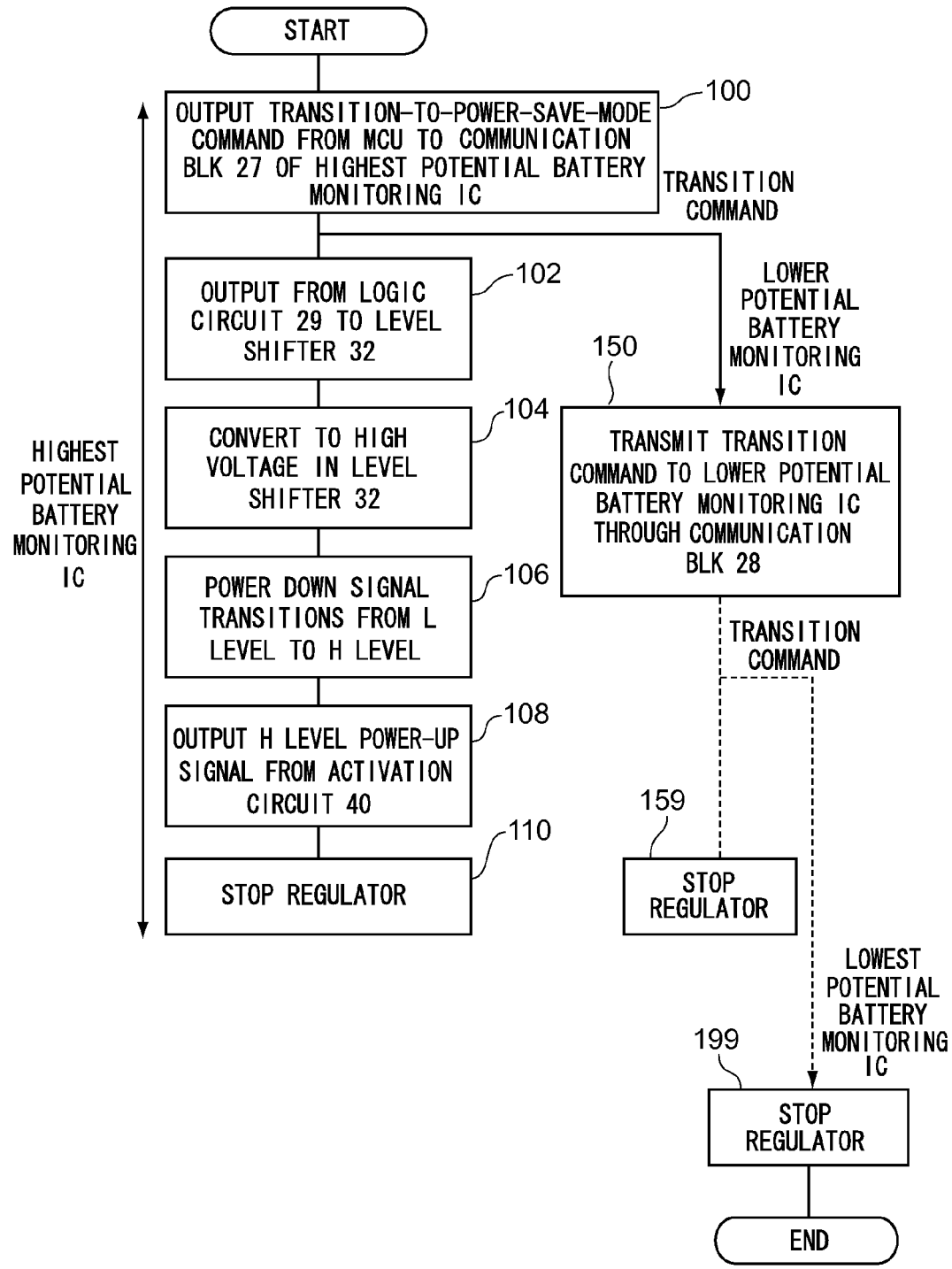

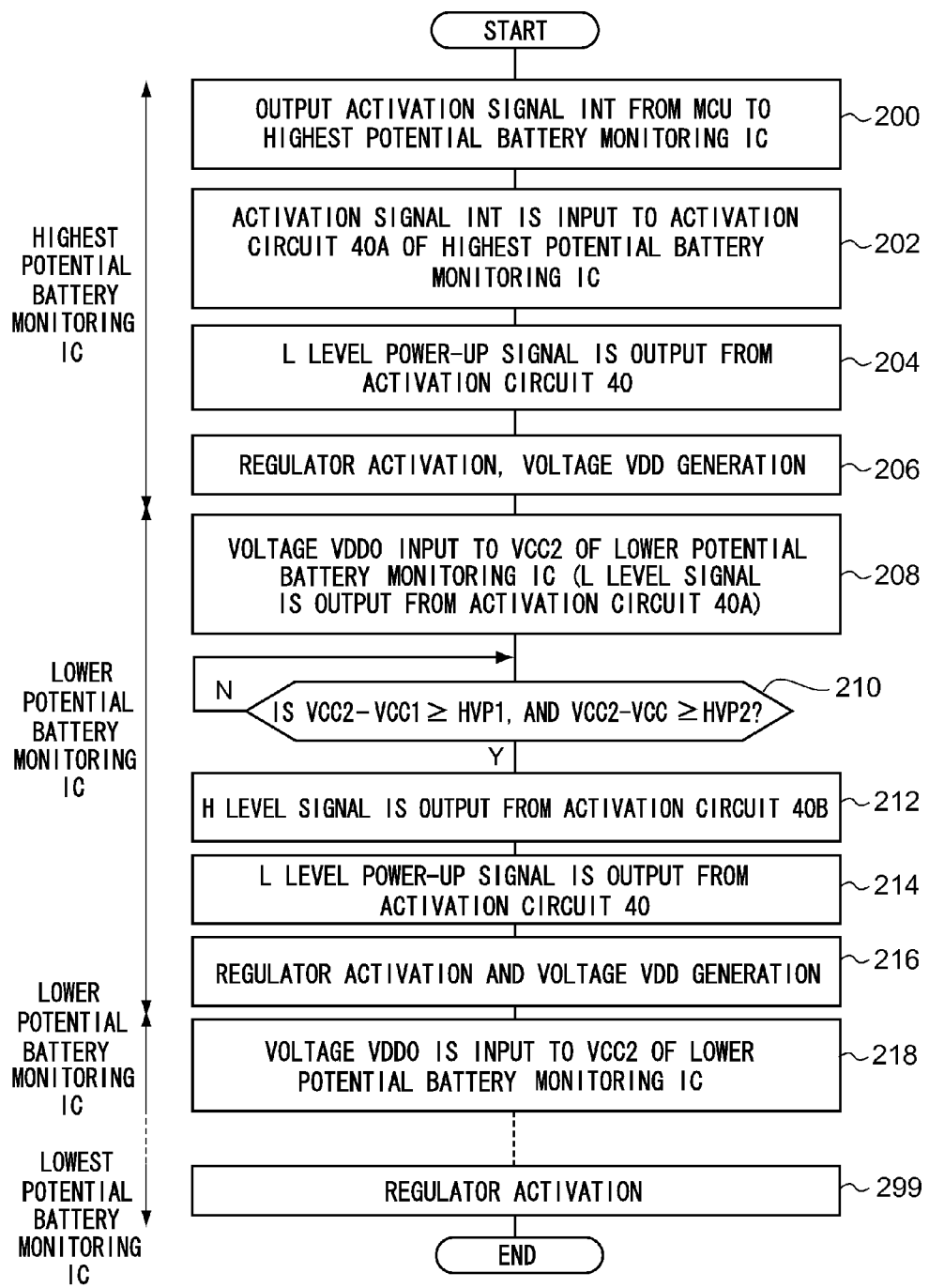

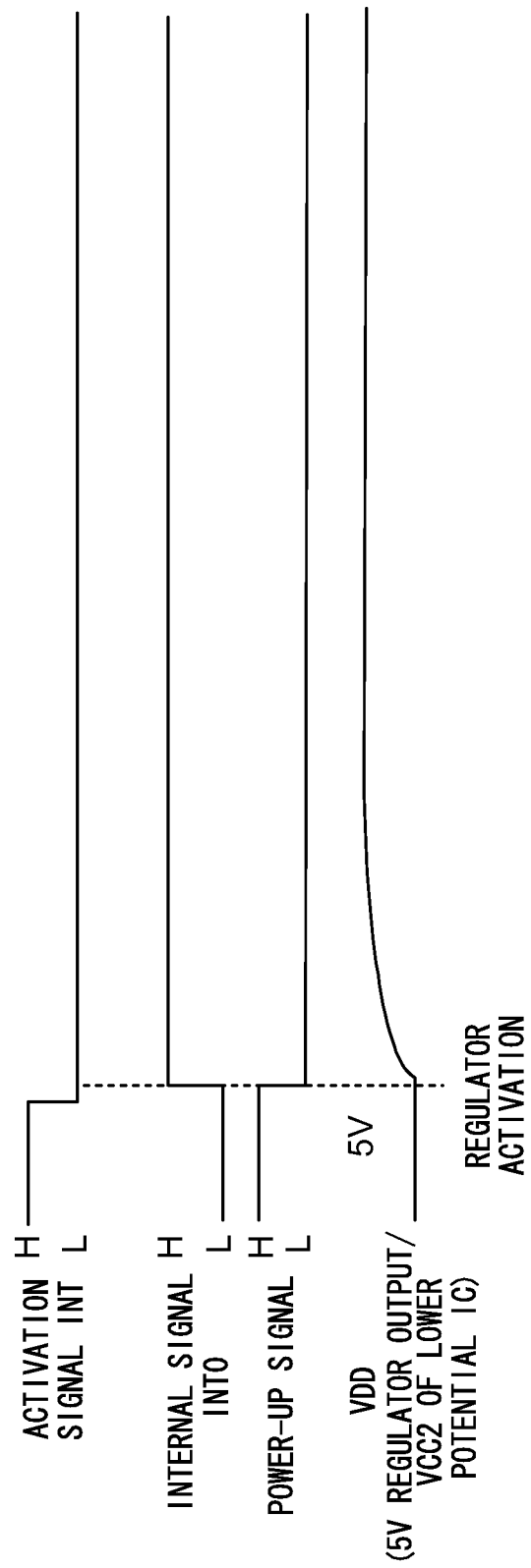

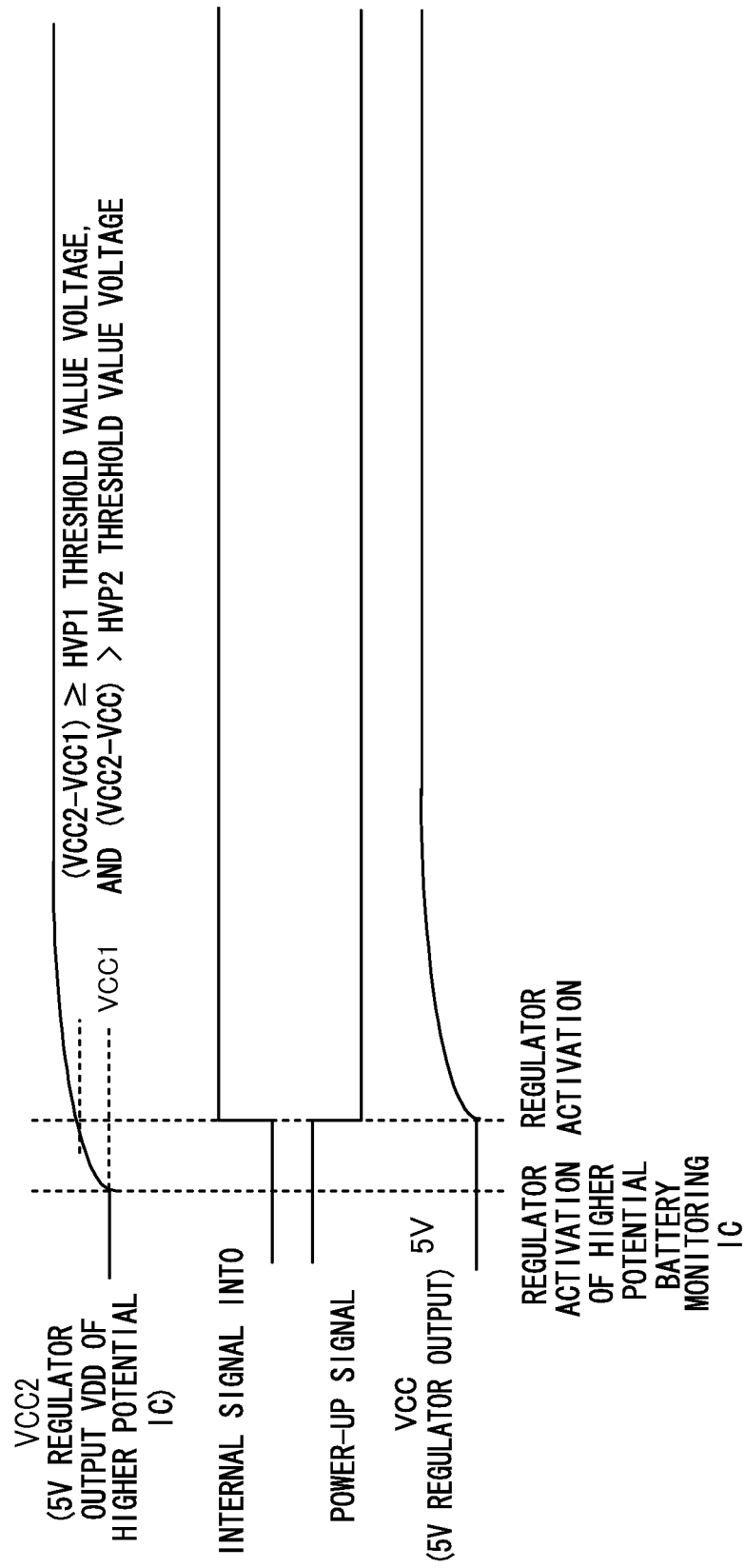

BATTERY MONITORING SYSTEM AND BATTERY MONITORING DEVICE

CROSS-REFERENCE TO RELATED APPLICATION

This application claims priority under 35 USC 119 from Japanese Patent Application No. 2013-002651 filed on Jan. 10, 2013, the disclosure of which is incorporated by reference herein.

BACKGROUND OF THE INVENTION

1. Field of the Invention

The present invention relates to a battery monitoring system and a battery monitoring device.

2. Description of the Related Art

Generally, as large capacity, high output batteries such as those employed in hybrid vehicle and electric vehicle motor drives, batteries are employed that are configured for example from plural battery cells, such as lithium ion battery cells, connected together in series so as to configure groups. Since such batteries have large capacities and high outputs, there is strong requirement to quickly detect states such as rapid voltage fluctuations that occur in battery cells for one reason or another, and to quickly and safely stop the operation of circuits and the like operated by the battery. Monitoring of battery voltages in plural battery cells is accordingly performed by plural battery monitoring devices.

A related battery monitoring system has respective circuits that are operably on power source supply from battery cell groups provided within each of plural installed battery monitoring devices, generally in a configuration in which the voltage of each respective battery cell group is measured by plural battery monitoring devices. However, with such battery monitoring systems, there are occasions when it is not always necessary to monitor the voltage of battery cells, such as circumstances in which the vehicle is not being driven, or in situations when parked with the engine not running.

However, the battery cell groups and the battery monitoring system are always electrically connected to each other, and since this is a state in which the voltage from the battery cell groups is being applied to the battery monitoring system, the voltage of the battery cells is always in a monitored state in the related battery monitoring system. Such a situation is not preferable from the perspective of power consumption.

Thus, in order to suppress power consumption of a battery monitoring system, for example as described in Japanese Patent Application Laid-Open (JP-A) No. H08-140204, although the battery cell groups and the battery monitoring system are always electrically connected to each other, a mode referred to as a sleep mode is provided, and the functions and operation of internal circuits operated by voltage supplied from the battery cell groups are stopped when not required.

In another field, for example in JP-A No. 2006-180486, technology is also described for stopping driving of a regulator during a sleep mode in order to achieve a reduction in power consumption.

SUMMARY OF THE INVENTION

The present invention has been made in view of the above circumstances and provides a battery monitoring system and a battery monitoring device.

According to a first aspect of the present invention, there is provided a battery monitoring system, including: plurality battery monitoring devices that are serially connected to each other, that are each provided for one of plural serially connected battery cell groups, and that monitor a voltage of plural battery cells included in each of the plural battery cell groups; and a control circuit that is connected to one battery monitoring device of the plural battery monitoring devices and that transmits a first activation signal to the one battery monitoring device, wherein each particular one of the plural battery monitoring devices includes: a constant voltage generation circuit that generates and outputs a constant voltage; a first activation circuit that outputs a second activation signal if the first activation circuit receives the first activation signal from the control circuit; and a second activation circuit that outputs a third activation signal in response to recognizing the constant voltage generated by the constant voltage generation of another of the battery monitoring devices that is connected to the particular battery monitoring device, and wherein the constant voltage generation circuit generates the constant voltage if the constant voltage generation circuit receives the second activation signal or the third activation signal.

According to a second aspect of the present invention, there is provided a battery monitoring device that is included in a battery monitoring system, the battery monitoring system including: plural battery monitoring devices that are serially connected to each other, that are each provided for one of plural serially connected battery cell groups, and that monitor a voltage of plural battery cells included in each of the plural battery cell groups; and a control circuit that is connected to one battery monitoring device of the plural battery monitoring devices and that transmits a first activation signal to the one battery monitoring device, each particular one of the battery monitoring devices included in the battery monitoring system including: a constant voltage generation circuit that generates and outputs a constant voltage; a first activation circuit that outputs a second activation signal if the first activation circuit receives the first activation signal from the control circuit; and a second activation circuit that outputs a third activation signal in response to recognizing the constant voltage generated by the constant voltage generation of another of the battery monitoring devices that is connected to the particular battery monitoring device, and wherein the constant voltage generation circuit generates the constant voltage if the constant voltage generation circuit receives the second activation signal or the third activation signal.

BRIEF DESCRIPTION OF THE DRAWINGS

Preferred embodiments of the present invention will be described in detail based on the following figures, wherein:

FIG. 7 is a flow chart illustrating an example of flow when transitioning to power save mode in the battery monitoring system of the first exemplary embodiment;

FIG. 8 is a flow chart illustrating an example of flow when returning from power save mode in the battery monitoring system of the first exemplary embodiment;

FIG. 9 is a timing chart illustrating an example of activation of the highest potential battery monitoring IC of the first exemplary embodiment;

FIG. 10 is a timing chart illustrating an example of activation of other battery monitoring ICs other than the highest potential battery monitoring IC of the first exemplary embodiment;

DETAILED DESCRIPTION OF THE INVENTION

Explanation follows regarding a battery monitoring system of the present exemplary embodiment, with reference to the drawings.

In order to achieve a further reduction in power consumption compared to the technology described in JP-A No. 08-140204 for battery monitoring systems, the present inventors have investigated stopping driving of a regulator during a sleep mode, such as in the technology described in JP-A No. 2006-180486.

However, it has been found that, when driving of the regulator is stopped, this inevitably leads to stopping driving of a circuit for performing communication with adjacent ICs, then when attempting to restart the battery monitoring system, start up from sleep mode can no longer be performed since communication can no longer be performed between adjacent battery monitoring devices.

Figure 19:
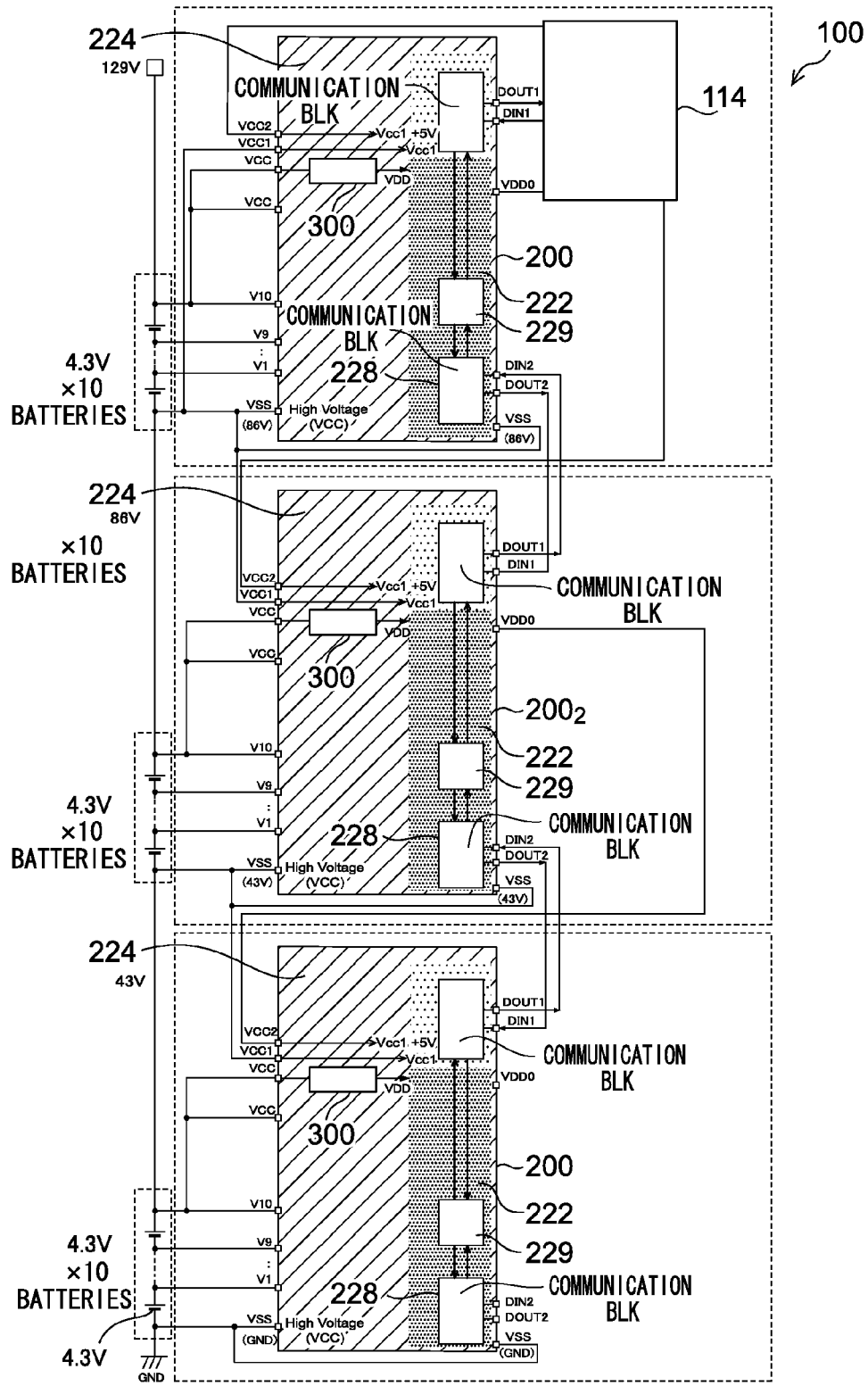
FIG. 19 is a schematic configuration diagram illustrating an example of a schematic configuration of a related battery monitoring system.

Explanation follows regarding a specific example. FIG. 19 illustrates a schematic configuration diagram of a related battery monitoring system 100. A case is illustrated in FIG. 19 in which 3 stages of battery monitoring IC 200 are connected together in series, with a control circuit section 114 connected to the battery monitoring IC 200 at the highest potential. A regulator 300 includes a function to generate and output a voltage electrical potential VDD of a low voltage region 222 from a high voltage region 224, and a circuit (logic circuit 229 and communication BLK 228) of the low voltage region 222 is driven by supply of the voltage electrical potential VDD. In the battery monitoring IC 200, by supplying a constant voltage to VCCs of the high voltage regions 224, the regulators 300 are activated at substantially the same time as each other, and the battery monitoring ICs 200 are activated. In power save mode, the voltage electrical potential VDD falls to the voltage electrical potential VSS when the regulators 300 are stopped, and therefore the communication BLKs 228 and the like also stop. It has been found, when returning from the power save mode, if a return command is input to the highest potential battery monitoring IC 200 from the control circuit section 114, this battery monitoring IC 200 is activated, however, that the return command from the power save mode cannot be transmitted to lower potential battery monitoring ICs 200 since communication between battery monitoring ICs 200 is not enabled due to the communication BLKs 228 being stopped.

Thus as described above, in a related battery monitoring IC 200, it has been discovered that driving of the regulators 300 cannot be stopped even in power save mode.

In view of the above circumstances, the present invention provides a battery monitoring system and a battery monitoring device capable of saving more power when in power save mode.

First Exemplary Embodiment

Figure 1:
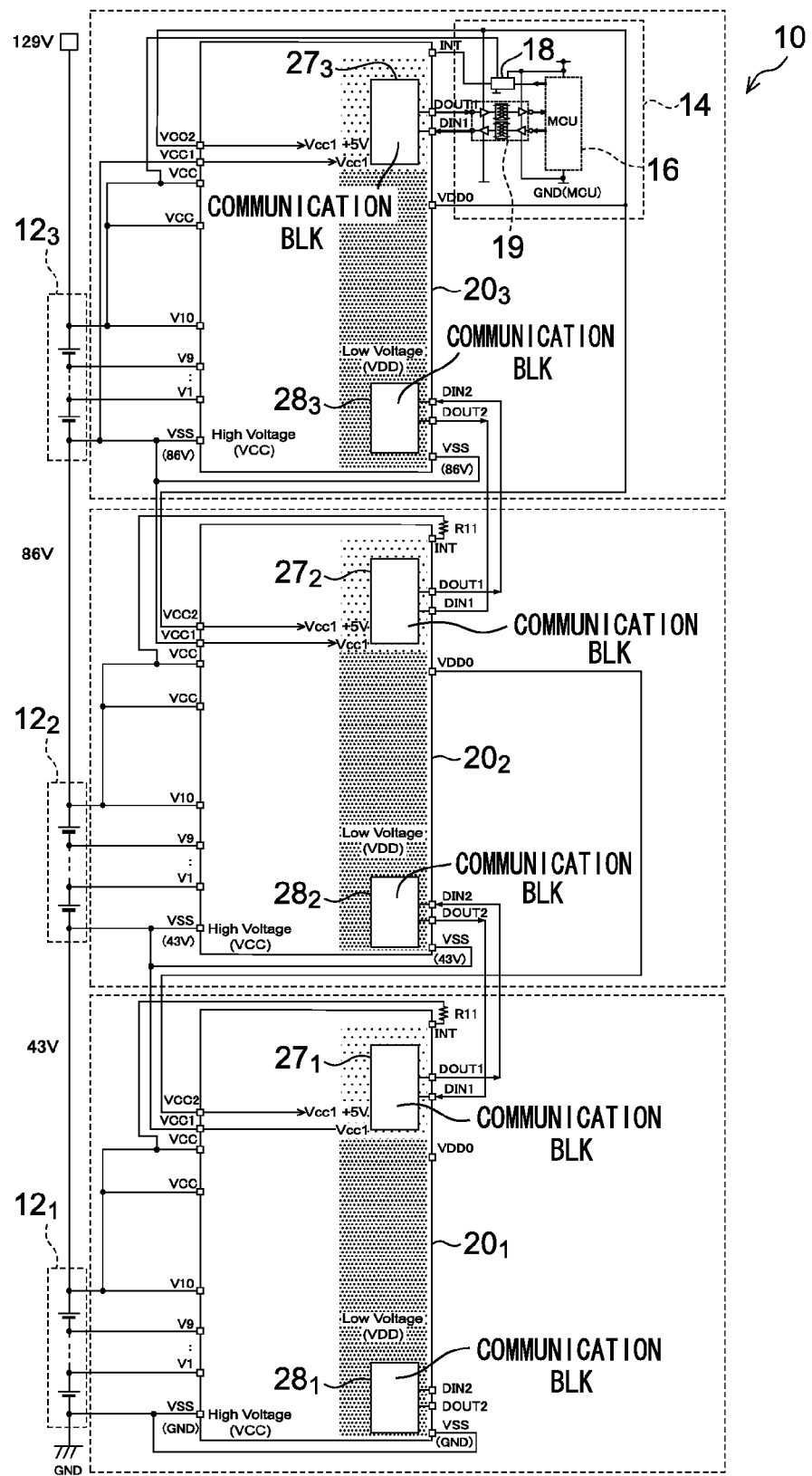
FIG. 1 is a schematic configuration diagram illustrating an example of a schematic configuration of a battery monitoring system of a first exemplary embodiment.

Explanation first follows regarding an overall schematic configuration of a battery monitoring system of the present exemplary embodiment. An example of a schematic configuration of a battery monitoring system of the present exemplary embodiment is illustrated in FIG. 1. Note that in the present exemplary embodiment, as a specific example, explanation follows regarding a battery monitoring system 10 that monitors voltage of battery cell groups 12 of plural lithium ion cells serving as secondary batteries and connected together in series.

The battery monitoring system 10 is configured including the battery cell groups 12, battery monitoring IC 20 that each monitor the respective voltages in the battery cell groups 12, and a control circuit section 14 that controls the overall operation of the battery monitoring system 10.

As a specific example, each of the battery cell groups 12 is configured including 10 individual lithium ion secondary battery cells (referred to below simply as "battery cells") E of individual battery voltage 4.3 V (battery cells E1 to E10). Accordingly, in the present exemplary embodiment, the total voltage of the voltage of each of the battery cell groups 12 is 43V. Note that "battery cells E" is simply employed to refer to the battery cells collectively, and individual suffixes are appended thereto when discriminating between individual battery cells.

FIG. 1 illustrates, as an example, the battery monitoring system 10 with 3 stages connected together in series, respectively configured by battery cell groups 12 (12₁ to 12₃) and the battery monitoring ICs 20 (20₁ to 20₃). Note that reference to battery cell groups collectively is simply expressed by "battery cell groups 12", and individual suffixes are appended thereto when discriminating between individual battery cell groups. Moreover, in the following, similarly to with the battery monitoring ICs 20 and the like, collective reference will be made without the use of specific suffixes, and individual suffixes will be appended when making individual discrimination.

The battery monitoring ICs 20 have a function to monitor the voltage of respective connected battery cell groups 12. Explanation is given in detail later, but briefly the battery monitoring ICs 20 are each configured including a communication BLK 27 that performs communication with the higher potential (high voltage side) battery monitoring IC 20, and a communication BLK 28 that performs communication with the lower potential (low voltage side) battery monitoring IC 20. Note that the collective reference to the communication BLKs is expressed simply as "communication BLKs 27", and individual suffixes will be appended when making individual discrimination.

Note that the control circuit section 14 is connected to the communication BLK 27₃ of the highest potential battery monitoring IC 20₃, and various data (signals) are transmitted and received between the communication BLK 27₃ and the control circuit section 14. A schematic configuration of the control circuit section 14 of the present exemplary embodiment is illustrated in FIG. 2.

Figure 2:
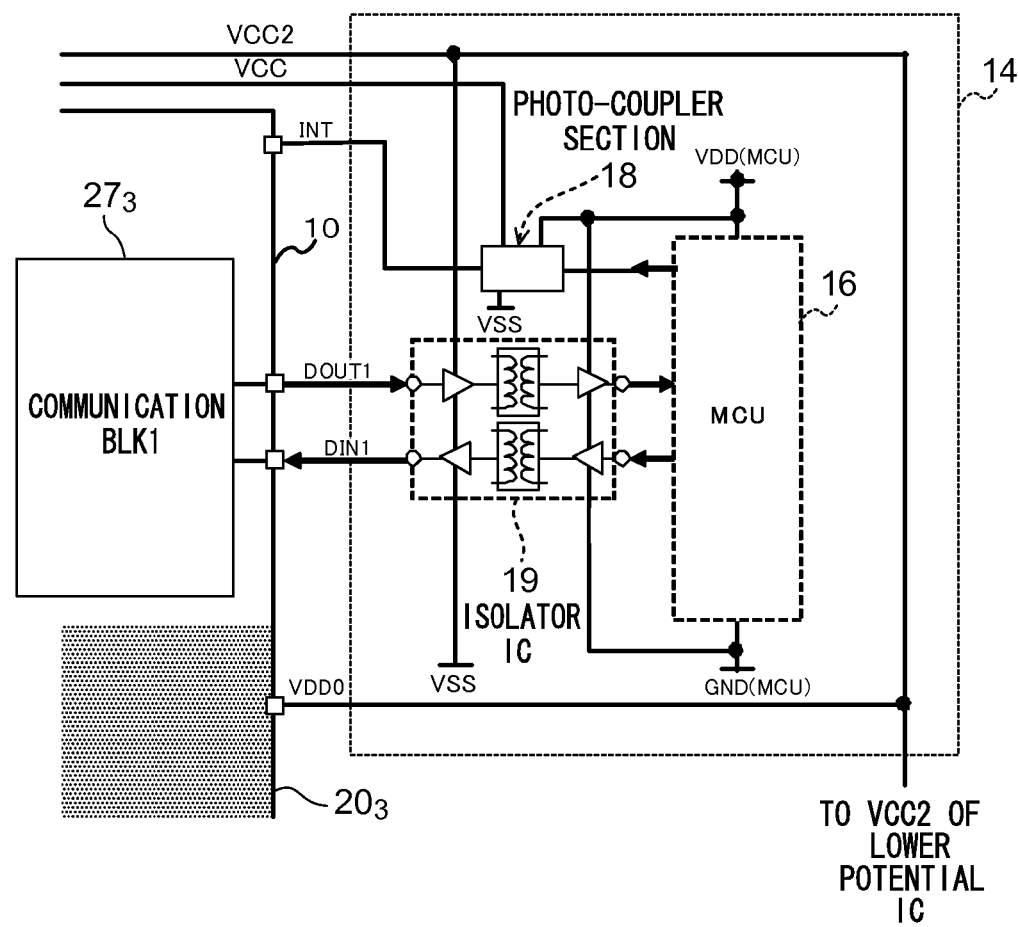
FIG. 2 is a schematic configuration illustrating an example of a control circuit section for provision to the battery monitoring system of the first exemplary embodiment.

As illustrated in FIG. 2, the control circuit section 14 is configured including a MCU 16, a photo-coupler section 18 and a dual channel isolator IC 19.

The MCU 16 includes a function to control the battery monitoring system 10 overall, and is configured by a general purpose microcomputer. The MCU 16 and the communication BLK 27₃ of the battery monitoring IC 20₃ are connected together through the isolator IC 19. The isolator IC 19 includes a function to electrically insulate between the MCU 16 and the battery monitoring IC 20₃, while also transmitting and receiving data and signals (control signals and the like, see DOUT1 and DIN1 of FIG. 2) such as related to battery voltage monitoring of the battery cell groups 12 between the MCU 16 and the communication BLKs 27 battery monitoring IC 20₃.

Figure 3:
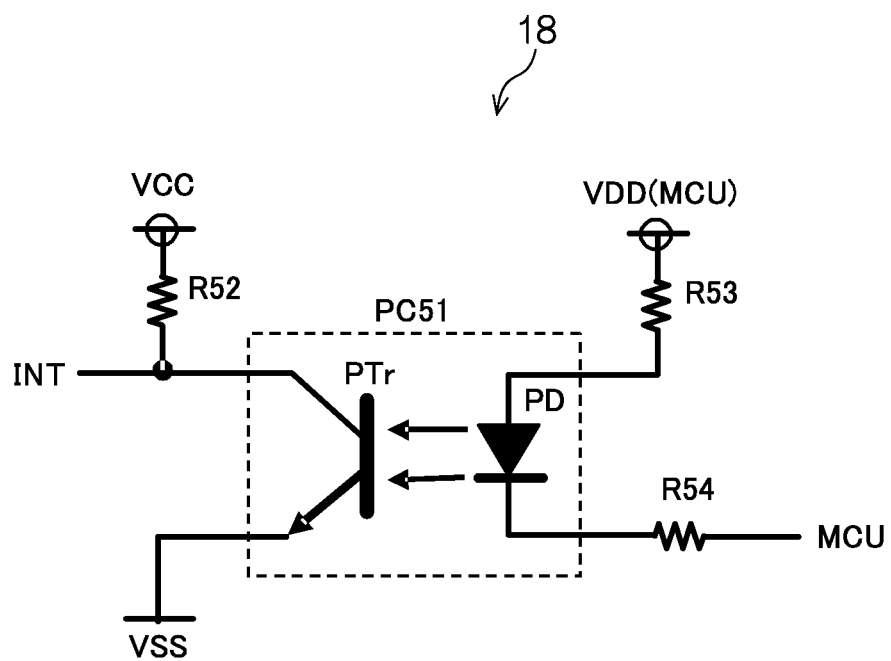
FIG. 3 is a circuit diagram illustrating an example of a photo-coupler section of the control circuit section of the first exemplary embodiment.

Moreover, in the battery monitoring system 10 according to the present exemplary embodiment, as illustrated in FIG. 2, the MCU 16 and the INT terminal of the battery monitoring IC 20₃ are connected through the photo-coupler section 18. The photo-coupler section 18 includes a function to electrically insulate between the MCU 16 and the battery monitoring IC 20₃, while also inputting a regulator (see regulator 30 of FIG. 4) activation signal INT that has been output from the MCU 16 to the battery monitoring IC 20₃. An example of the photo-coupler section 18 is illustrated in FIG. 3. As illustrated in FIG. 3, the photo-coupler section 18 of the present exemplary embodiment is, for example, configured including a photo-transistor PTr, and an infrared light emitting diode PD. The anode of the infrared light emitting diode PD is connected to the voltage electrical potential VDD (the MCU 16) through a resistor R53, and the cathode of the infrared light emitting diode PD is connected to the MCU 16 through a resistor R54. The emitter of the photo-transistor PTr is connected to the voltage electrical potential VSS, and the collector of the photo-transistor PTr is connected to a voltage electrical potential VCC through a resistor R52 and also connected to the INT terminal of the battery monitoring IC 20₃. The photo-transistor PTr is activated according to emitted light of the infrared light emitting diode PD.

Note that, as illustrated in FIG. 1, the INT terminals of the battery monitoring ICs 20 other than the highest potential battery monitoring IC 20₃ are connected through respective resistors R11 to their own voltage electrical potential VCCs (that are at the same potential as respective highest potential voltages V10 of their own battery cell groups 12).

Note that the photo-coupler section 18 and the isolator IC 19 are not limited to the configurations of the present exemplary embodiment, and other configurations may be employed therefor, and an IC provided with both functions (for example a 3 channel photo-coupler) or the like may also be employed.

Moreover, as illustrated in FIG. 1, VDD0 terminals of the battery monitoring ICs 20 are connected to VCC2 terminals of lower potential (directly below) battery monitoring ICs 20, and a voltage electrical potential VCC2 of each of the lower potential battery monitoring ICs 20 is supplied from the higher potential battery monitoring IC 20. Moreover, the VSS terminals of the battery monitoring ICs 20 are connected to VCC1 terminals of lower potential (directly below) battery monitoring ICs 20, and each of the voltage electrical potentials VSS of the higher potential battery monitoring ICs 20 (these being the voltage of the lowest potential of the higher potential battery cell groups 12) is supplied as a voltage electrical potential VCC1 of the respective lower potential battery monitoring IC 20.

Figure 4:
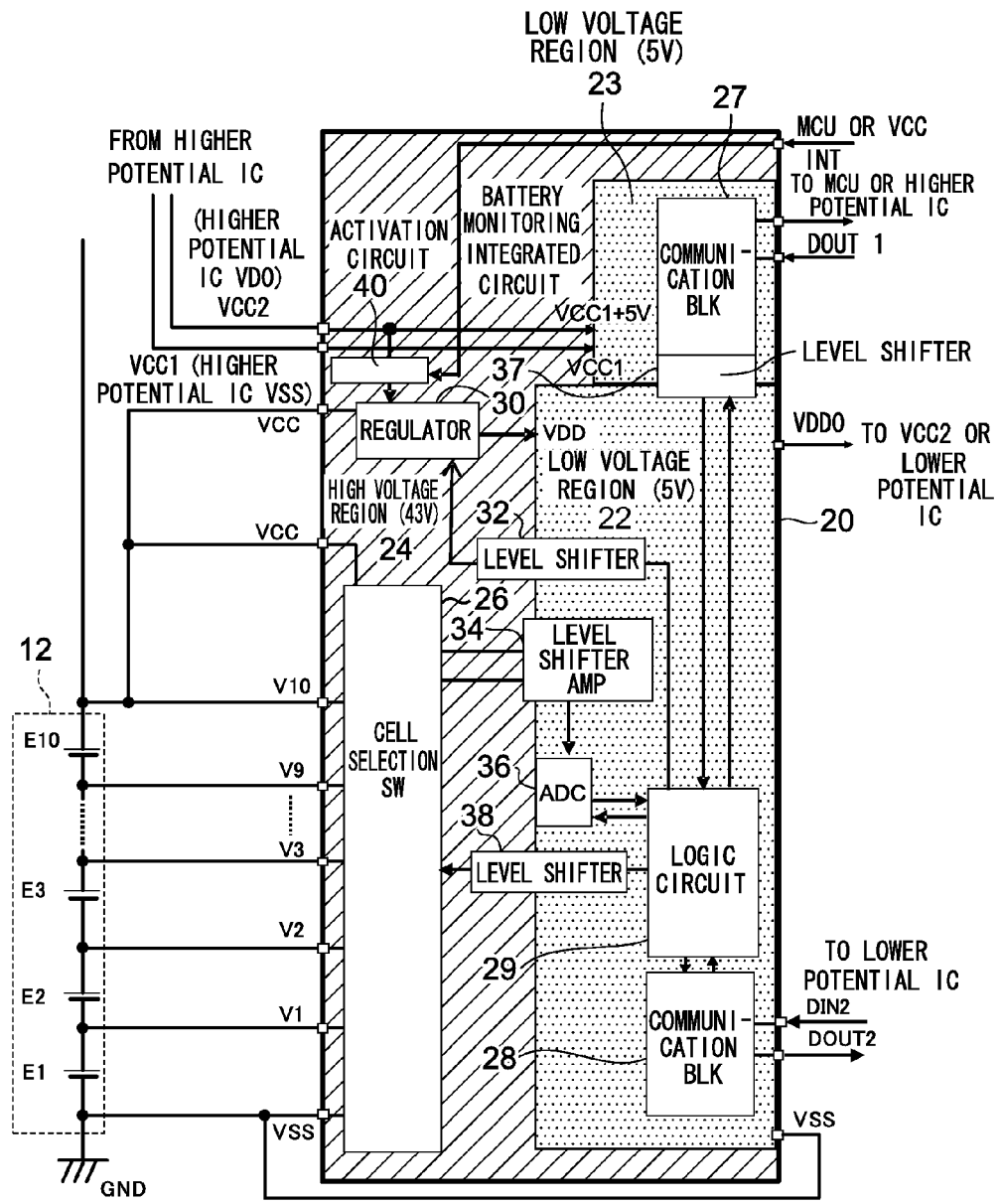
FIG. 4 is a schematic diagram illustrating a schematic configuration of an example of the battery monitoring IC of the first exemplary embodiment.

Explanation now follows regarding details of the battery monitoring ICs 20 of the present exemplary embodiment. FIG. 4 is a schematic configuration diagram illustrating an example of one of the battery monitoring ICs 20 of the present exemplary embodiment.

The battery monitoring ICs 20 of the present exemplary embodiment are each configured including 3 regions, a low voltage region 22, a low voltage region 23, and a high voltage region 24. In the present exemplary embodiment, as a specific example, the voltage of the low voltage region 22 and the low voltage region 23 is 5V, and the voltage of the high voltage region 24 is 43V.

The battery monitoring IC 20 is supplied with a voltage electrical potential VCC that is the power source voltage from the highest electrical potential side of the battery cell group 12. The battery monitoring ICs 20 is also supplied with the voltage electrical potential VSS from the lowest electrical potential side of the battery cell group 12. In the battery cell group 12 of the present exemplary embodiment, since there are 10 individual serially connected lithium ion secondary batteries E each of 4.3V, the voltage electrical potential VCC is expressed by following Equation (1). Note that the voltage electrical potential VSS is expressed by following Equation (2).

$$VCC = (4.3V \times 10 \text{ batteries}) \times \text{number of stages} \quad \text{Equation (1)}$$

$$VSS = (4.3V \times 10 \text{ batteries}) \times (\text{number of stages} - 1) \quad \text{Equation (2)}$$

When the battery monitoring IC 20 is for the highest electrical potential (third stage), then according to Equation (1), $VCC = (4.3 \times 10) \times 3 = 129V$. Moreover, according to Equation (2), $VSS = (4.3 \times 10) \times (3-1) = 86V$. The highest electrical potential battery monitoring IC 20 is connected to the MCU 16 of the control circuit section 14 as described above. Generally, since the power supply voltage electrical potential of the MCU 16 is 5V and the ground voltage electrical potential is 0V, the highest electrical potential battery monitoring IC 20 is connected to the MCU 16 of the control circuit section 14 through the photo-coupler section 18 and the isolator IC 19.

Moreover, the battery monitoring ICs 20 of the present exemplary embodiment each include a cell selection SW (switch) 26, the communication BLK 27, the communication BLK 28, the regulator 30, the level shifter 32, a level shifter amp 34, an ADC (analogue-to-digital converter) 36, a level shifter 38, and an activation circuit 40.

The regulator 30 is provided at the high voltage region 24, and is connected to a logic circuit 29 through a level shifter 32. The regulator 30 includes a function for generating voltage electrical potential VDD from the voltage electrical potential VCC at high voltage supplied from the battery cell group 12 and supplying the voltage electrical potential VDD to the low voltage region 22. The voltage electrical potential VDD is a drive voltage for the circuits and the like provided at the low voltage region 22. In order to activate the battery monitoring IC 20 of the present exemplary embodiment, first the regulator 30 is activated, and the regulator generates the voltage electrical potential VDD. Accordingly, the activation method of the regulator 30 is the activation method of the battery monitoring IC 20. Moreover, when operation of the regulator 30 is stopped, the voltage electrical potential VCC ceases to be supplied to the low voltage region 22, and accordingly the circuits such as the communication BLK 28 provided in the low voltage region 22 also stop operating. The regulator 30 of the present exemplary embodiment, as an example, is activated when the level of the regulator activation signal (power-up signal) is L level, and accordingly is in a drive state. Moreover, driving of the regulator 30 is stopped when the level of the regulator activation signal (power down signal) is H level.

The communication BLK 27 is provided at the low voltage region 23, and includes a function to input signal DIN1 from a higher (directly above) electrical potential battery monitoring IC 20 or the MCU 16 (for the highest electrical potential battery monitoring IC 20), and to output signal DOUT1. Moreover, the communication BLK 27 also performs sending and receiving of various signals (commands) to and from the logic circuit 29 through a level shifter 37.

The communication BLK 28 is provided at the low voltage region 22, and includes a function to accept an input signal DIN2 from the lower potential (directly below) battery monitoring IC 20, and to output signal DOUT2. Moreover, the communication BLK 28 also performs sending and receiving of various signals (commands) to and from the logic circuit 29.

The cell selection SW 26 includes plural switching elements corresponding to each of the battery cells E of the battery cell group 12, and includes a function to select battery cells E from the battery cell group 12 by ON/OFF controlling the switching elements, and to equalize the voltages of the battery cells E. The voltage value of the high voltage side and the voltage value of the low voltage side of the battery cells E selected by the cell selection SW 26 are output to the logic circuit 29 through the level shifter amp 34 and the ADC 36. Various signals (commands) are input from the logic circuit 29 to the cell selection SW 26 through the level shifter 38. The battery voltage of the battery cell groups 12 is monitored by the cell selection SW 26 and the logic circuit 29.

The activation circuit 40 includes a function to output a power-up signal that is a regulator activation signal that controls activation of the regulator 30. An example of a circuit diagram of the activation circuit 40 of the present exemplary embodiment is illustrated in FIG. 5.

Figure 5:
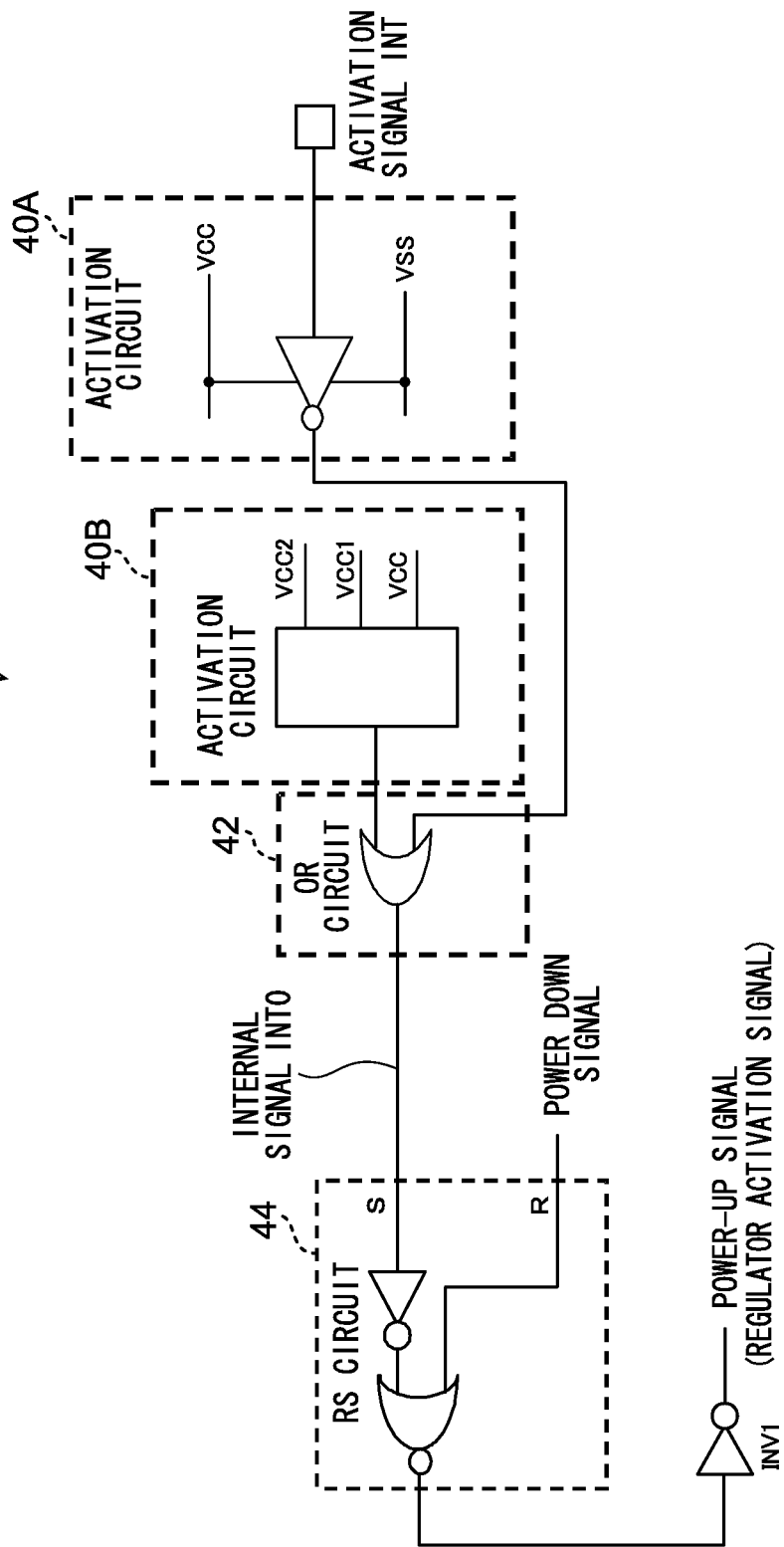
FIG. 5 is a circuit diagram illustrating an example of an activation circuit (activation circuit 40) of the battery monitoring IC of the first exemplary embodiment.

As illustrated in FIG. 5, the activation circuit 40 is configured including an activation circuit 40A, an activation circuit 40B, an OR circuit 42, an RS circuit 44, and an inverter INV1.

In the highest potential battery monitoring IC 20$_3$, the activation circuit 40A includes a function to output an internal signal for generating a power-up signal (L level) for activating the regulator 30 in response to the activation signal INT input from the MCU 16 of the control circuit section 14. The activation circuit 40A is configured with power source terminals respectively connected to the voltage electrical potential VCC and the voltage electrical potential VSS, and is configured by an inverter with the activation signal INT as the input signal.

In the battery monitoring ICs 20 other than the highest potential battery monitoring IC 20$_3$ (the lower potential battery monitoring ICs 20), the activation circuit 40B includes a function to output an internal signal for generating a power-up signal (L level) for activating the regulator 30 according to the voltage electrical potential VCC2 and the voltage electrical potential VCC1 input from the higher potential battery monitoring IC 20 and the voltage electrical potential VCC. Note that in the present exemplary embodiment, when the internal signal is at H level, the power-up signal is at L level.

Figure 6A:
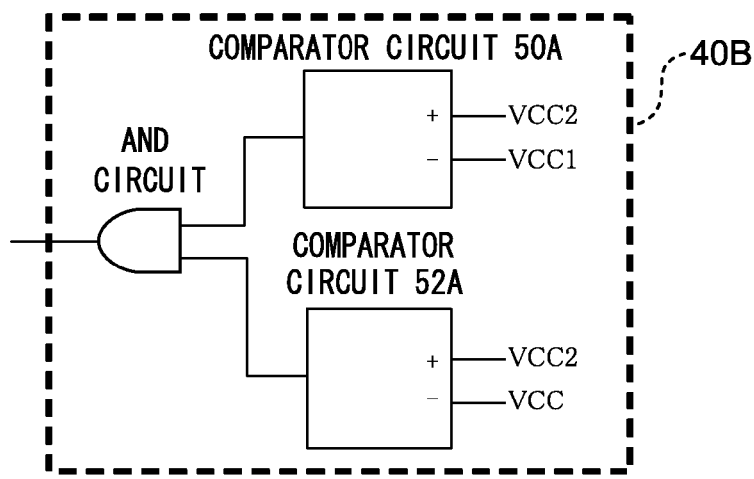
FIG. 6A is a circuit diagram illustrating an example of an activation circuit (activation circuit 40B) of the activation circuit (activation circuit 40) of the first exemplary embodiment, and illustrates an example of a general schematic.
Figure 6B:
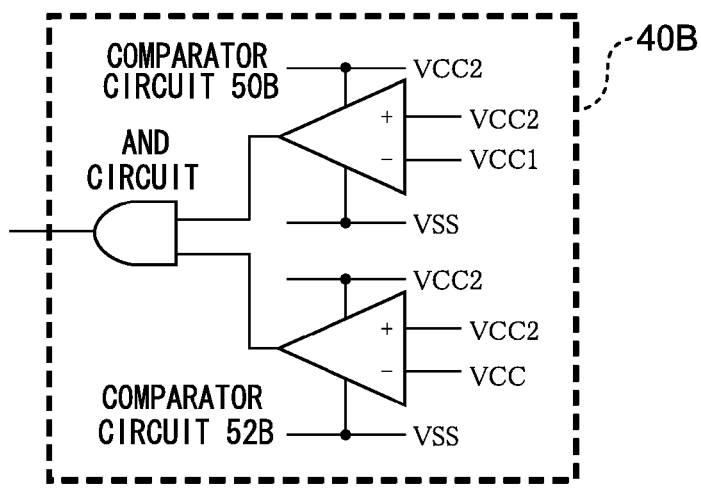
FIG. 6B is a circuit diagram illustrating a specific example of an activation circuit (activation circuit 40B) of the activation circuit (activation circuit 40) of the first exemplary embodiment, and illustrates a specific example.
Figure 6C:
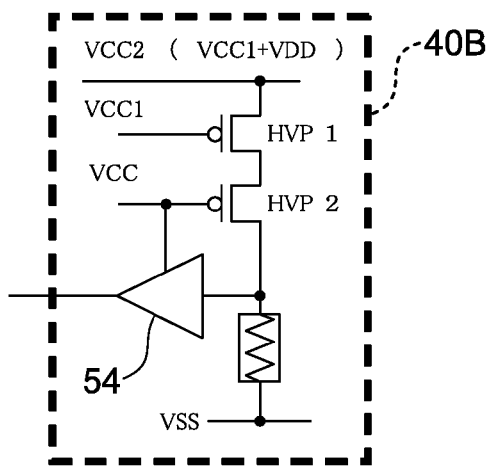
FIG. 6C is a circuit diagram illustrating a specific example of an activation circuit (activation circuit 40B) of the activation circuit (activation circuit 40) of the first exemplary embodiment, and illustrates a specific example.

The activation circuit 40B generates the internal signal based on a comparison result between the voltage electrical potential VCC2 and the voltage electrical potential VCC1, and a comparison result between the voltage electrical potential VCC2 and the voltage electrical potential VCC. Examples of the activation circuit 40B are illustrated in FIGS. 6A to 6C. The activation circuit 40B illustrated in FIG. 6A is a general schematic example of the activation circuit 40B, and FIG. 6B and FIG. 6C are other specific examples thereof.

The activation circuit 40B illustrated in FIG. 6A is configured including a comparator circuit 50A, a comparator circuit 52A, and an AND circuit. The comparator circuit 50A compares the voltage electrical potential VCC2 with the voltage electrical potential VCC1, and outputs an H level signal when VCC2>VCC1. However, the comparator circuit 52A compares the voltage electrical potential VCC2 and the voltage electrical potential VCC, and outputs an H level signal when VCC2>VCC. The internal signal is accordingly output from the activation circuit 40B at H level when VCC2>VCC1 and VCC2>VCC. Note that in order to stabilize operation of the activation circuit 40B, preferably VCC2>VCC1+A, and VCC2>VCC+A (wherein A is an offset voltage). Moreover, preferably 1V to VDD/2 is employed as the offset voltage A.

The activation circuit 40B illustrated in FIG. 6B is configured including a comparator circuit (comparator) 50B, a comparator circuit (comparator) 52B, and an AND circuit. The comparator circuit 50B has power source terminals respectively connected to the voltage electrical potential VCC2 and the voltage electrical potential VSS, compares the voltage electrical potential VCC2 with the voltage electrical potential VCC1, and outputs an H level signal when VCC2>VCC1. In other hands, the comparator circuit 52B has power source terminals respectively connected to the voltage electrical potential VCC2 and the voltage electrical potential VSS, compares the voltage electrical potential VCC2 and the voltage electrical potential VCC, and outputs an H level signal when VCC2>VCC. The internal signal is accordingly output from the activation circuit 40B at H level when VCC2>VCC1 and VCC2>VCC. Note that in order to stabilize operation of the activation circuit 40B, preferably comparator circuit 50B and the comparator circuit 52B are configured with an offset voltage such that VCC2>VCC1+A, and VCC2>VCC+A (wherein A is an offset voltage). Moreover, preferably 200 mV to VDD/2 is employed here as the offset voltage A.

The activation circuit 40B illustrated in FIG. 6C has a PMOS transistor HVP1, a PMOS transistor HVP2 and an amplifier 54. The PMOS transistor HVP1 and the PMOS transistor HVP2 are connected together in series, the other end of the PMOS transistor HVP1 is connected to the voltage electrical potential VCC2, and the other end of the PMOS transistor HVP2 is connected to the voltage electrical potential VSS through a resistor. The voltage electrical potential VCC1 is connected to the gate of the PMOS transistor HVP1, and the voltage electrical potential VCC is connected to the gate of the PMOS transistor HVP2. Thus, if (VCC2−VCC1) ≥HVP1 (the threshold value for the PMOS transistor HVP1 to be in the ON state), and (VCC2−VCC)≥HVP2 (the threshold value for the PMOS transistor HVP2 to be in the ON state), the internal signal is output at H level.

There are no particular limitations regarding configuration of the activation circuit 40B, and by configuring as illustrated in FIG. 6C, a configuration can be achieved in which the number of elements is reduced compared to other cases, and this is preferable since it enables a reduction in surface area and a lower current consumption of the chip to be achieved.

The internal signal output from the activation circuit 40A and the internal signal output from the activation circuit 40B are input to the OR circuit 42, and an internal signal INT0 expressing a logical value according to both internal signals is output from the OR circuit 42 to the RS circuit 44.

The internal signal INT0 is input to the setting side of the RS (reset) circuit 44. A power down signal for controlling to stop the regulator 30 is input to the re-set side. The output of the RS circuit 44 is input to regulator 30 through inverter INV1 as a power-up signal (regulator drive signal).

Explanation next follows regarding transition to power save mode and return operation from power save mode in the battery monitoring system 10 of the present exemplary embodiment. In the present exemplary embodiment, if the battery monitoring system 10 is employed to monitor the battery voltage of the battery cell groups 12 employed in a vehicle, as described above, when parked with the engine not in a running state, there is no need to monitor the voltage of battery cells such that they do not fall into an abnormal state, such as an over charged state or an over discharged state. In the battery monitoring system 10, in order save power in such a case, the voltage electrical potential VCC is applied as the battery voltage in each of the battery monitoring ICs 20, and circuits (for example the cell selection SW 26) and the like are operated by the voltage electrical potential VCC, however transition is made to what is referred to as a power save mode (sleep mode) in order to stop function and/or operation.

In the present exemplary embodiment, in transition to power save mode and return to operation from power save mode, the MCU 16 of the control circuit section 14 monitors the drive state of the engine, and then a command for transition to or return from the power save mode is issued to the battery monitoring system 10 (the battery monitoring IC 20) based on the drive state.

Explanation first follows regarding a flow of transition to the power save mode in the battery monitoring system 10 of the present exemplary embodiment. FIG. 7 illustrates a flow chart of an example of flow of transition to the power save mode in the battery monitoring system 10. First, when the MCU 16 detects engine drive stop, transition to power save mode as illustrated in FIG. 7 is started.

First, as illustrated in FIG. 7, a transition command to power save mode is output from the MCU 16 to the communication BLK 27 of the highest potential battery monitoring IC $20_3$ (step 100). On receipt thereof, in the highest battery monitoring IC $20_3$, the transition command is input from the communication BLK 27 to the logic circuit 29, and the transition command is output from the logic circuit 29 to the level shifter 32 (step 102). In the level shifter 32, the transition command is converted into the voltage level of the high voltage region 24 (high voltage: 43V) (step 104). A power down signal thereby transitions from L level to H level (step 106). The RS circuit 44 of the activation circuit 40 is reset when the power down signal transitions to H level. Since the internal signal is output at L level from the RS circuit 44 to the inverter INV1, a power-up signal at H level is output from the activation circuit 40 (step 108). The regulator 30 of the battery monitoring IC $20_3$ stops drive operation when the power-up signal becomes H level.

The voltage electrical potential VDD that is the output of the regulator 30 drops to voltage electrical potential VSS when the regulator 30 stops. Note that in this state, since the circuits such as the communication BLK 27, the communication BLK 28 and the logic circuit 29 are also in a stopped state, communication can no longer be performed between the MCU 16, and the lower potential (directly below) battery monitoring IC $20_2$.

In the battery monitoring IC $20_3$, on receipt of the transition command to power save mode from the MCU 16, the transition command is transmitted to the lower potential (directly below) battery monitoring IC $20_2$ through the communication BLK 28 (step 150). In the lower potential battery monitoring IC $20_2$ to which the transition command has been transmitted, similarly to in the situation described above, the regulator 30 is stopped (step 159). Note that in a similar manner the transition command is transmitted to the lower potential battery monitoring IC 20, and the regulator 30 of the lowest potential battery monitoring IC 20 is stopped, thereby completing transition to power save mode.

Thus, in the battery monitoring system 10 of the present exemplary embodiment, in the power save mode it is possible to completely stop the regulators 30 of all the battery monitoring ICs 20, and to let the voltage electrical potential VDD of the low voltage region 22 and the low voltage region 23 that is the regulator output to fall to the electrical potential of the voltage electrical potential VSS. The current consumption during the power save mode in each of the battery monitoring ICs 20 can thereby be limited to only the OFF leakage of transistors used in the circuits, thereby enabling the static current (Iccs) during power save mode to be greatly reduced.

Explanation next follows regarding flow of return from the power save mode in the battery monitoring system 10 of the present exemplary embodiment. FIG. 8 is a flow chart of an example of flow during return from power save mode in the battery monitoring system 10. A timing chart of activation of the highest potential battery monitoring IC $20_3$ is also illustrated in FIG. 9. A timing chart of activation of the battery monitoring ICs 20 other than the highest potential is illustrated in FIG. 10. Explanation follows regarding, as a specific example, a case of an activation circuit 40 provided with the activation circuit 40B as illustrated in FIG. 6C.

When the MCU 16 detects driving of the engine, the return from power save mode illustrated in FIG. 8 is started. Note that in the battery monitoring system 10 of the present exemplary embodiment, as explained in detail below, first the regulator 30 of the highest potential battery monitoring IC $20_3$ is activated, and then the regulators 30 of the lower potential battery monitoring ICs 20 are activated in sequence.

As illustrated in FIG. 8, first the activation signal INT (that is a signal that transitions from H level (voltage electrical potential VCC) to L level (voltage electrical potential VSS)) that is a command from the MCU 16 to the communication BLK 27 of the highest potential battery monitoring IC $20_3$ to return from the power save mode and to activate the regulator 30 is output (step 200). Note that as an example the battery monitoring system 10 of the present exemplary embodiment is designed such that the battery monitoring ICs 20 (regulators 30) are in an active state when the activation signal INT is L level.

On receipt thereof, the L level activation signal INT is input to the activation circuit 40 (the activation circuit 40A) of the battery monitoring IC $20_3$ (step 202). An H level internal signal is thereby output from the activation circuit 40A to the OR circuit 42. In response to the H level signal from the activation circuit 40A, the OR circuit 42 outputs the internal signal INT0 at H level to the RS circuit 44. Since the power down signal input to the reset side of the RS circuit 44 is L level, the H level internal signal from the RS circuit 44 is output to the inverter INV1. The power-up signal (regulator activation signal) at L level is thereby output from the activation circuit 40 (step 204).

When the power-up signal becomes L level, the regulator 30 of the battery monitoring IC $20_3$ is activated and adopts the drive state, and generates the voltage electrical potential VDD (step 206). The electrical potential of the generated voltage electrical potential VDD gradually rises, as illustrated in FIG. 9. Each of the circuits of the low voltage region 22 and the low voltage region 23 are activated by being supplied with the generated voltage electrical potential VDD, with the battery monitoring IC $20_3$ adopting the drive state.

When the regulator 30 is activated, the voltage electrical potential VDD0 from the VDD0 terminal provided to the low voltage region 22 is input to the lower potential (directly below) battery monitoring IC $20_2$ (step 208).

When this occurs, in the battery monitoring IC $20_2$, according to above Equation (1) and Equation (2), VCC=(4.3V×10 cells)×2=86V and VSS=(4.3V×10 cells)×(2−1)=43V. The voltage electrical potential VCC1=the voltage electrical potential VSS of the higher potential battery monitoring IC $20_3$=86V. Moreover, voltage electrical potential VCC2=the voltage electrical potential VDD0 of the higher potential battery monitoring IC $20_3$=the voltage electrical potential VSS of the battery monitoring IC $20_3$+5V=86V+5V=91V. As described above, in the battery monitoring IC $20_3$, the voltage electrical potential VDD gradually rises according to startup of the regulator, and therefore in response to this rise, as illustrated in FIG. 10, the voltage electrical potential VCC2 of the battery monitoring IC $20_2$ also gradually rises.

In the activation circuit 40B of the activation circuit 40, the level of the signal being output from the activation circuit 40B stays unchanged at L level while at least one condition out of VCC2−VCC1<HVP1 and VCC2−VCC<HVP2 is satisfied (step 210=N). When both VCC2−VCC1≥HVP1 and VCC2−VCC≥HVP2 are satisfied by the rising voltage electrical potential VCC2 (step 210=Y), the PMOS transistor HVP1 and the PMOS transistor HVP2 of the activation circuit 40B adopt an ON state. An H level internal signal is thereby output from the activation circuit 40B to the OR circuit 42 (step 212). In response to this H level internal signal, an internal signal INT0 at H level is output from the OR circuit 42. Note that the INT terminal of the battery monitoring IC $20_2$ is connected to the voltage electrical potential VCC through the protection resistor R11, and so voltage electrical potential VCC is input as the activation signal INT to the activation circuit 40A. Thereby the OR circuit 42 is in a state in which the OR circuit 42 is input with the internal signal at L level from the activation circuit 40A. Thus in the battery monitoring ICs 20 other than the highest potential battery monitoring IC 20 of the present exemplary embodiment, the activation signal INT with a voltage electrical potential of VCC is input to the activation circuit 40A of the activation circuit 40, and hence the output of the activation circuit 40A can be suppressed from becoming indeterminate.

Since the power down signal input to the reset side of the RS circuit 44 is L level, an internal signal at H level is output from the RS circuit 44 to the inverter INV1. The L level power-up signal (regulator activation signal) is thereby output from the activation circuit 40 (step 214).

When the power-up signal becomes L level, the regulator 30 of the battery monitoring IC $20_2$ is activated and is in a drive state, and generates the voltage electrical potential VDD (step 216). As illustrated in FIG. 10, the electrical potential of the generated voltage electrical potential VDD gradually rises, in a similar manner to the voltage electrical potential VDD of the higher potential battery monitoring IC $20_3$ as described above. Each of the circuits of the low voltage region 22 and the low voltage region 23 are activated by being supplied with the generated voltage electrical potential VDD, and the battery monitoring IC $20_2$ is in a drive state.

Moreover, when the regulator 30 is activated (and the battery monitoring IC 20 also activated), the voltage electrical potential VDD0 from the VDD0 terminal is input to the lower potential (directly below) battery monitoring IC $20_1$ (step 218). Subsequently, in a similar manner, the voltage electrical potential VCC2 rises in response to the rise in the voltage electrical potential VDD, and processing is performed such that the power-up signal is output at L level when the relationships of step 210 are satisfied, and the regulator 30 activated (and the battery monitoring IC 20 also activated), as far as the lowest potential battery monitoring IC 20. When the regulator 30 of the lowest potential battery monitoring IC 20 (the battery monitoring IC 20) is activated (step 299), this completes return from power save mode.

In the present exemplary embodiment, when returning from power save mode, the activation signal INT at L level for activating the regulator 30 is input from the MCU 16 of the control circuit section 14 to the activation circuit 40 of the highest potential battery monitoring IC $20_3$. In the activation circuit 40A of the activation circuit 40, an H level signal is output to the OR circuit 42 in response to the activation signal INT, and the power-up signal is output at L level from the activation circuit 40. The regulator 30 is thereby activated, and the battery monitoring IC $20_3$ activated. Along with the rise in electrical potential of the voltage electrical potential VDD due to activation of the regulator 30, in the activation circuit 40 of the lower potential battery monitoring IC 20, the voltage electrical potential VCC2 rises. The internal signal is output at H level from the activation circuit 40B to the OR circuit 42 when both VCC2−VCC1≥HVP1 and VCC2−VCC≥HVP2 are satisfied. Thus by activating the regulator 30 thereby, the battery monitoring IC 20 is activated. All of the battery monitoring ICs 20 in the battery monitoring system 10 can be activated in this manner.

Second Exemplary Embodiment

In the first exemplary embodiment, explanation has been given of a case in which, when returning from power save mode, first the highest potential battery monitoring IC $20_3$ is activated, and then the lower potential battery monitoring ICs 20 are activated in sequence. In contrast thereto, in the present exemplary embodiment, first the lowest potential battery monitoring IC $20_1$ is activated, and then the higher potential battery monitoring ICs 20 are activated in sequence.

Note that configuration and operation of the battery monitoring system 10 and the battery monitoring ICs 20 in the present exemplary embodiment include configuration and operation substantially the same as that of the first exemplary embodiment, and portions that are similar will be noted and detailed explanation thereof omitted.

Figure 11:
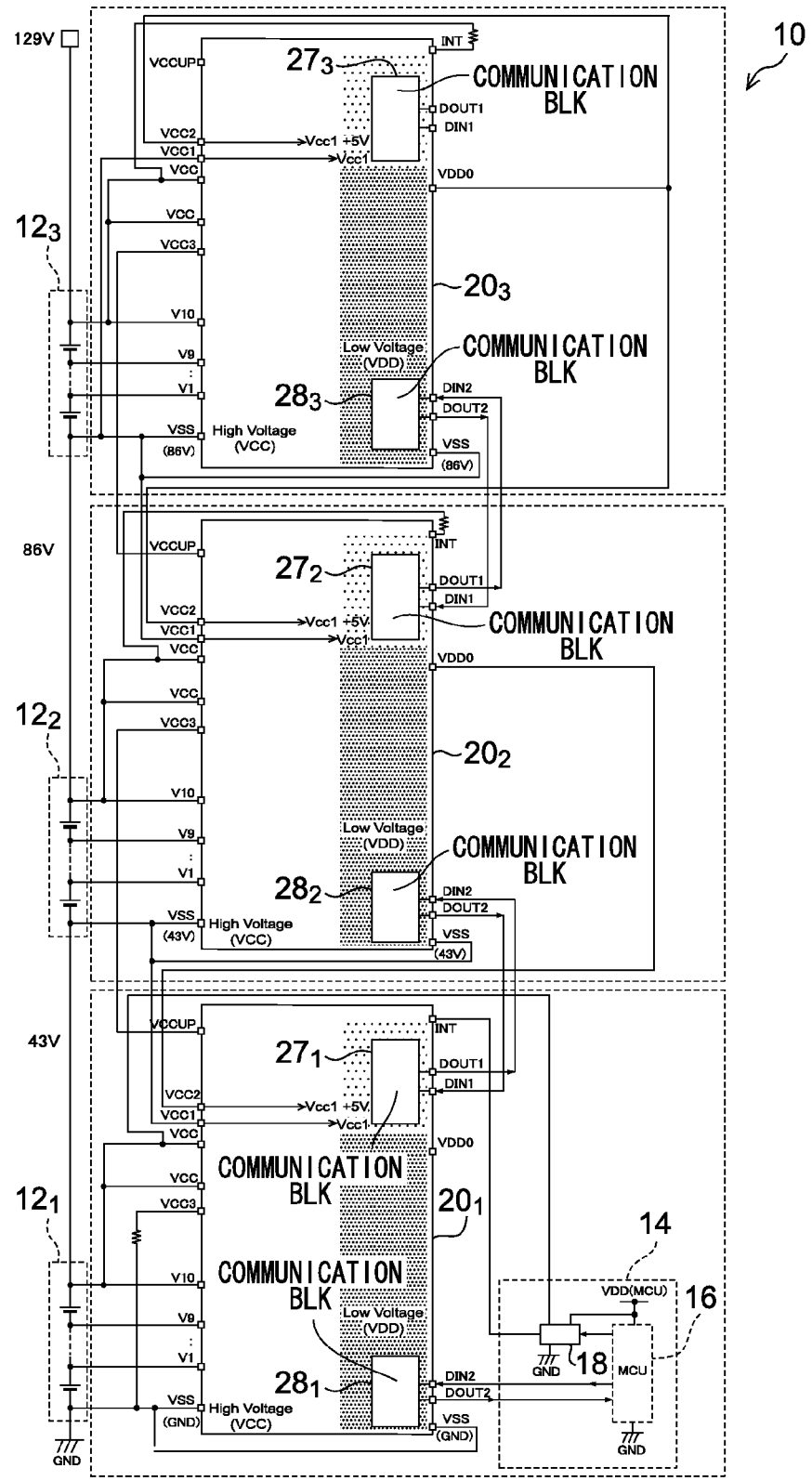
FIG. 11 is a schematic configuration diagram illustrating an example of a schematic configuration of a battery monitoring system of a second exemplary embodiment.

Explanation first follows regarding an overall schematic configuration of a battery monitoring system of the present exemplary embodiment. An example of a schematic configuration of the battery monitoring system according to the present exemplary embodiment is illustrated in FIG. 11. In the battery monitoring system 10 of the present exemplary embodiment, in contrast to in the first exemplary embodiment, a control circuit section 14 is connected to the lowest potential battery monitoring IC 20. Specifically, the control circuit section 14 is connected to a communication BLK $28_1$ of the highest potential battery monitoring IC $20_1$, and various data (signals) are transmitted and received between the control circuit section 14 and the communication BLK $28_1$. Note that the control circuit section 14 according to the present exemplary embodiment is provided with the MCU 16 and the photo-coupler section 18. In the low voltage region 22 of the lowest potential battery monitoring IC $20_1$, the voltage electrical potential VSS is 0V and the voltage electrical potential VDD is 5V, and so matches the voltage electrical potential of the electrical system of the MCU 16. Thus in contrast to the first exemplary embodiment of the present invention, the MCU 16 and the communication BLK $28_1$ can be connected without connecting through a photo-coupler, isolator IC or the like.

Moreover, in the battery monitoring system 10 of the present exemplary embodiment, similarly to in the first exemplary embodiment, the MCU 16 and the INT terminal of the battery monitoring IC $20_1$ are connected through the photo-coupler section 18.

Moreover, in the present exemplary embodiment a VCC3 terminal is provided in addition to a VCC1 terminal and a VCC terminal described in the first exemplary embodiment. The VCC3 terminal is connected to a VCCUP terminal of a lower potential (directly below) battery monitoring IC 20, and an output voltage VCCUP of a boosting circuit 62 of the lower potential battery monitoring IC 20 is supplied as the voltage electrical potential VCC3.

Figure 12:
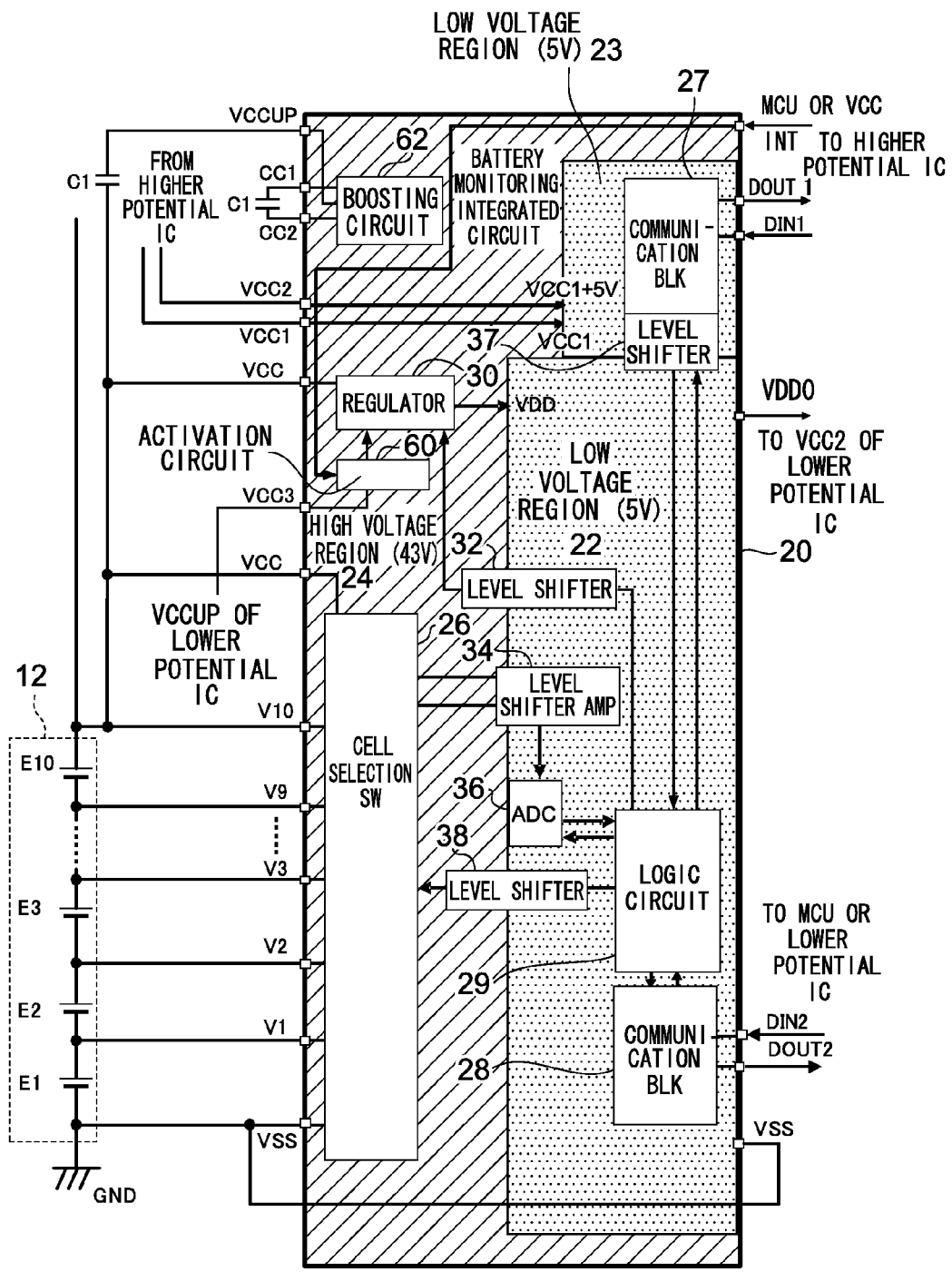
FIG. 12 is a schematic configuration diagram illustrating a schematic configuration of an example of a battery monitoring IC of the second exemplary embodiment.

Detailed explanation next follows regarding the battery monitoring ICs 20 of the present exemplary embodiment. FIG. 12 is a schematic configuration diagram illustrating an example of the battery monitoring IC 20 according to the present exemplary embodiment. An activation circuit 60 is provided in place of the activation circuit 40 of the first exemplary embodiment, and the boosting circuit 62 is also provided. Note that a regulator 30 of the present exemplary embodiment, similarly to in the first exemplary embodiment, is a regulator that is activated when the level of the regulator activation signal (power-up signal) becomes L level, and thereby is in an activation state. Moreover, driving of the regulator 30 is stopped when the level of the regulator activation signal (power-up signal) becomes H level.

The boosting circuit 62 has a function to generate the voltage VCCUP in which the output voltage electrical potential VDD of the regulator 30 is added to the electrical potential VCC, and to output this voltage. There are no particular limitations to the specific configuration of the boosting circuit 62, and a general boosting circuit may be employed. Note that generally the battery monitoring ICs 20 are provided with a boosting circuit to execute a cell voltage measurement function. Such a boosting circuit may be employed to double as the boosting circuit 62 of the present exemplary embodiment, thereby eliminating the need for a new circuit (boosting circuit) to be provided.

The activation circuit 60 includes a function to output a power-up signal that is the regulator activation signal to control activation of the regulator 30. An example of a circuit diagram of the activation circuit 60 according to the present exemplary embodiment is illustrated in FIG. 13.

Figure 13:
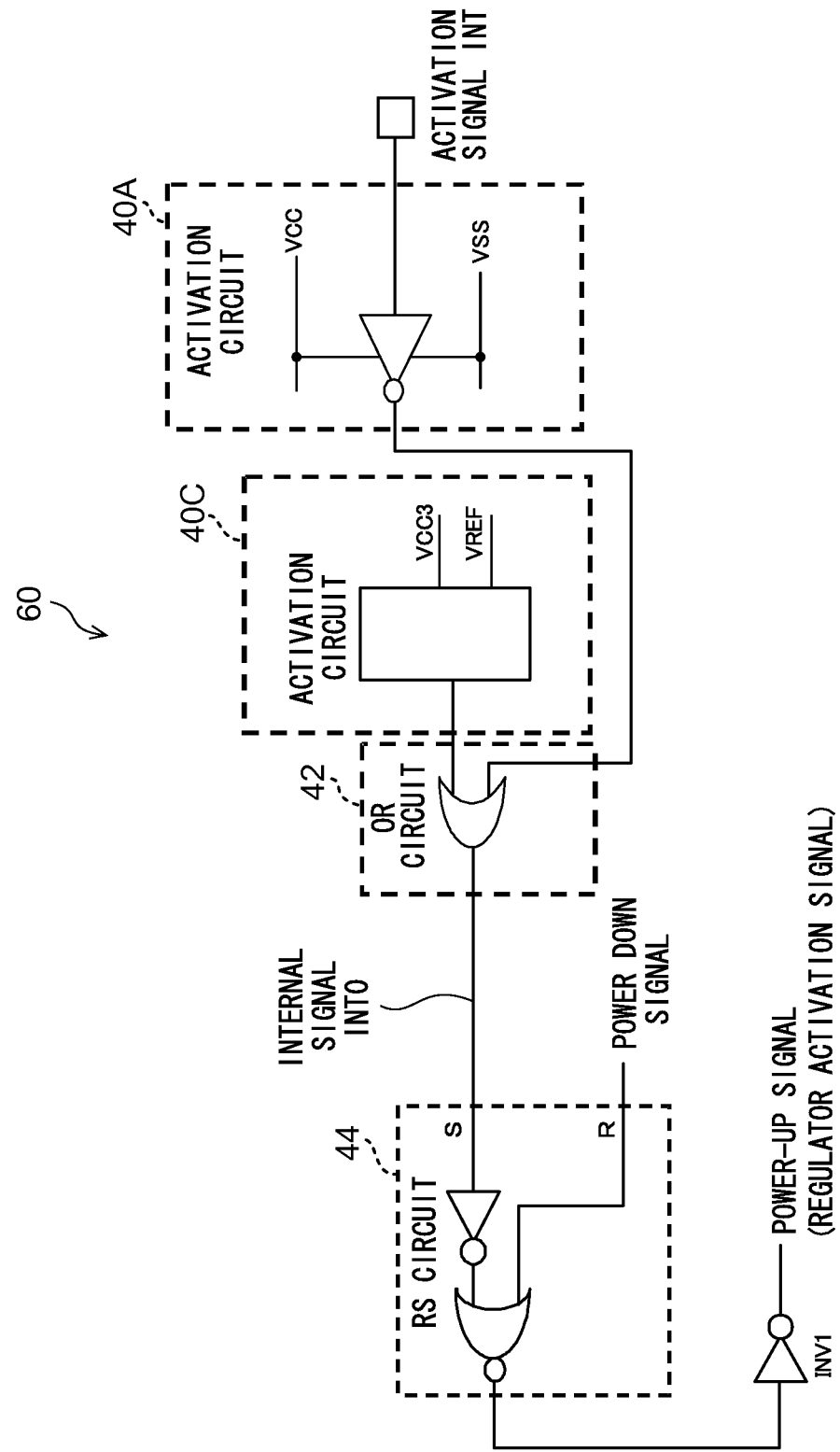
FIG. 13 is circuit diagram illustrating an example of an activation circuit (activation circuit 60) of a battery monitoring IC of the second exemplary embodiment.

As illustrated in FIG. 13, the activation circuit 60 of the present exemplary embodiment is provided with an activation circuit 40C in place of the activation circuit 40B of the activation circuit 40 of the first exemplary embodiment. The activation circuit 40C has a function to compare the voltage electrical potential VCC3 (the output VCCUP of the boosting circuit 62 of the lower potential battery monitoring IC 20) with a reference voltage electrical potential VREF, and to output an internal signal at H level to the OR circuit 42 when VCC3>VREF is satisfied. Note that reference voltage electrical potential VREF is preferably VDD/2, such that voltage electrical potential VCC3=output VCCUP of the boosting circuit 62 of the lower potential battery monitoring IC 20=voltage electrical potential VCC+voltage electrical potential VDD of the lower potential battery monitoring IC 20.

Figure 14:
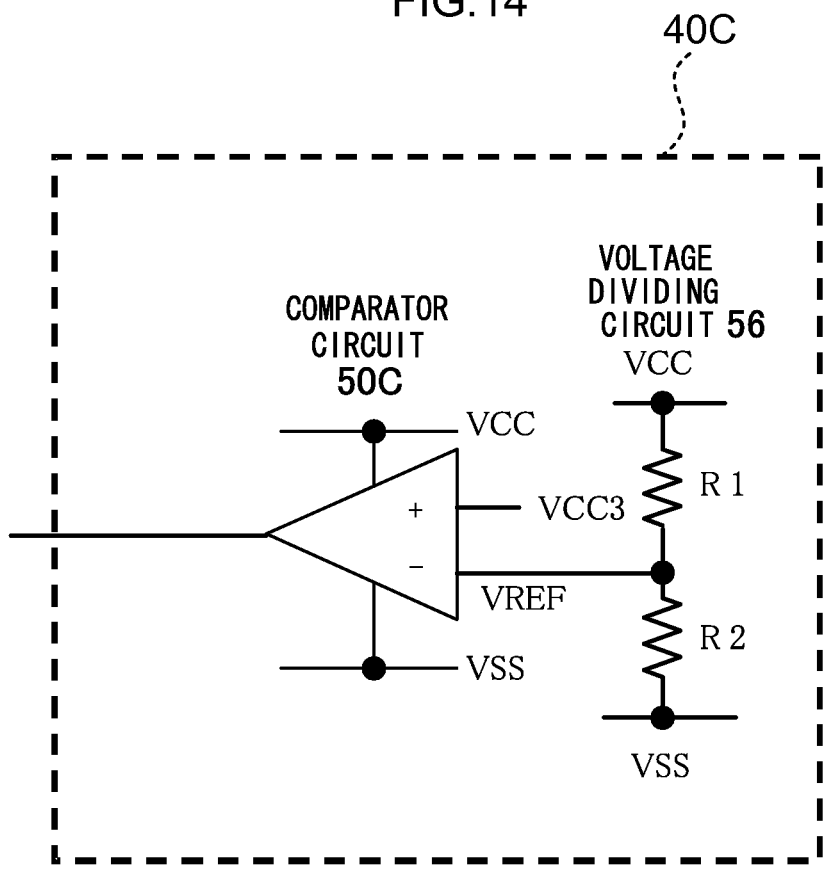
FIG. 14 is a circuit diagram illustrating an example of an activation circuit (activation circuit 40C) of the activation circuit (activation circuit 60) of the second exemplary embodiment.

An example of the activation circuit 40C is illustrated in FIG. 14. The activation circuit 40C illustrated in FIG. 14 is provided with a comparator circuit (comparator) 50C, and a voltage dividing circuit 56. The voltage dividing circuit 56 divides the voltage VCC−VSS using resistor R1 and resistor R2, and generates the reference voltage electrical potential VREF. As stated above, preferably the electrical potential of the reference voltage electrical potential is VDD/2. As a specific example, when VCC=43V and VSS=0V, the resistor R1 and the resistor R2 are selected such that R1:R2=81:5. VREF=VCC×R2/(R1+R2)=43V×25/(405+25)=2.5V, enabling a reference voltage electrical potential VREF of 2.5V to be generated.

The voltage electrical potential VCC and the voltage electrical potential VSS are respectively connected to the power source terminals of the comparator circuit 50C, the voltage electrical potential VCC3 and the reference voltage electrical potential VREF are compared, and an H level signal is output when VCC3>VREF. Note that the comparator circuit 50C preferably does not have an offset in such cases.

In the present exemplary embodiment, similarly to with the activation circuit 40B of the first exemplary embodiment, an H level internal signal is output from the activation circuit 40C to the OR circuit 42, and a L level power-up signal (regulator activation signal) is output from the activation circuit 40.

Explanation next follows regarding return activation from power save mode in the battery monitoring system 10 of the present exemplary embodiment. Note that transition to the power save mode is similar to that of the first exemplary embodiment, and so explanation thereof is omitted.

Figure 15:
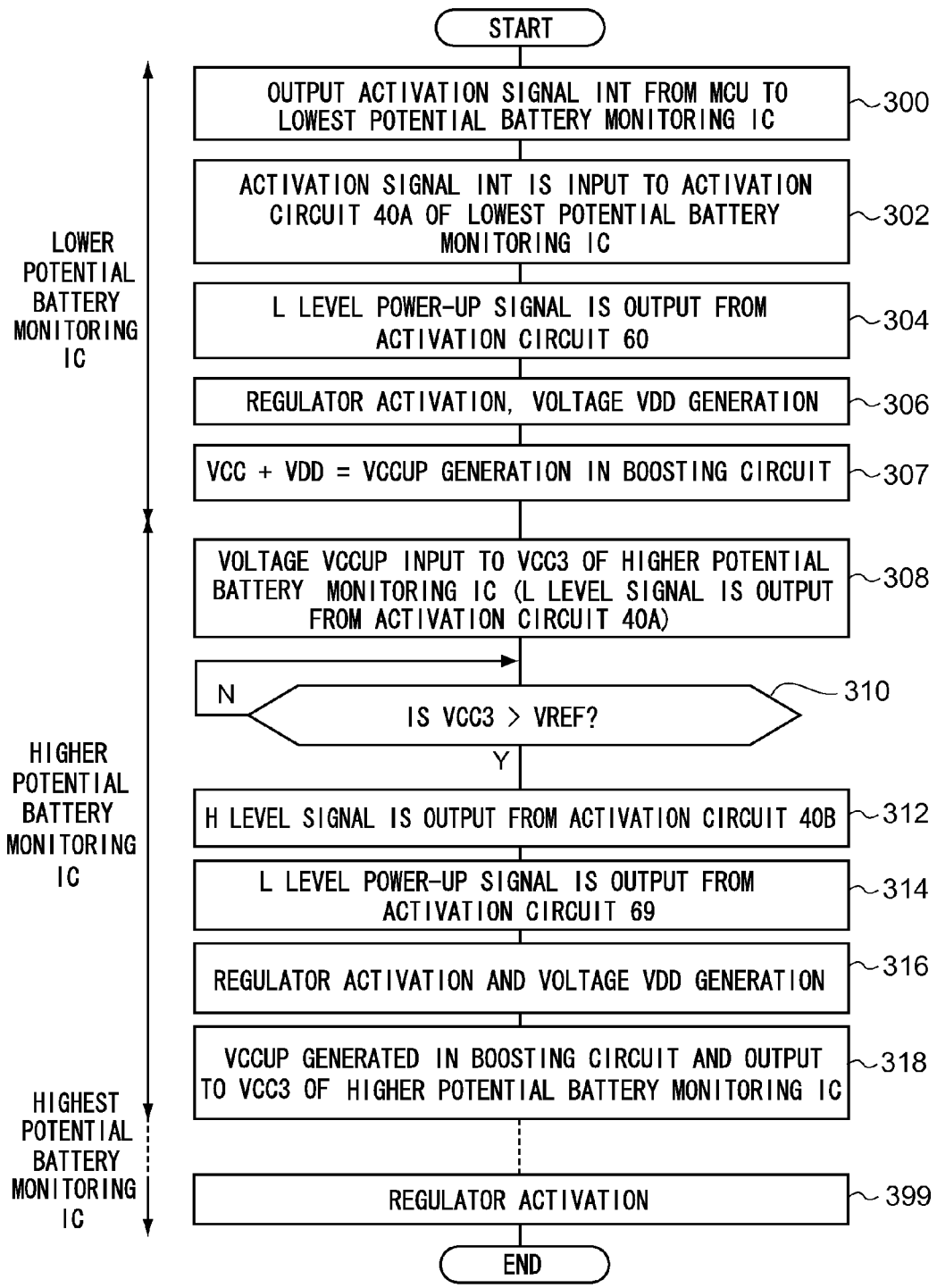
FIG. 15 is a flow chart illustrating an example of flow when returning from power save mode in the battery monitoring system according to the second exemplary embodiment.
Figure 16:
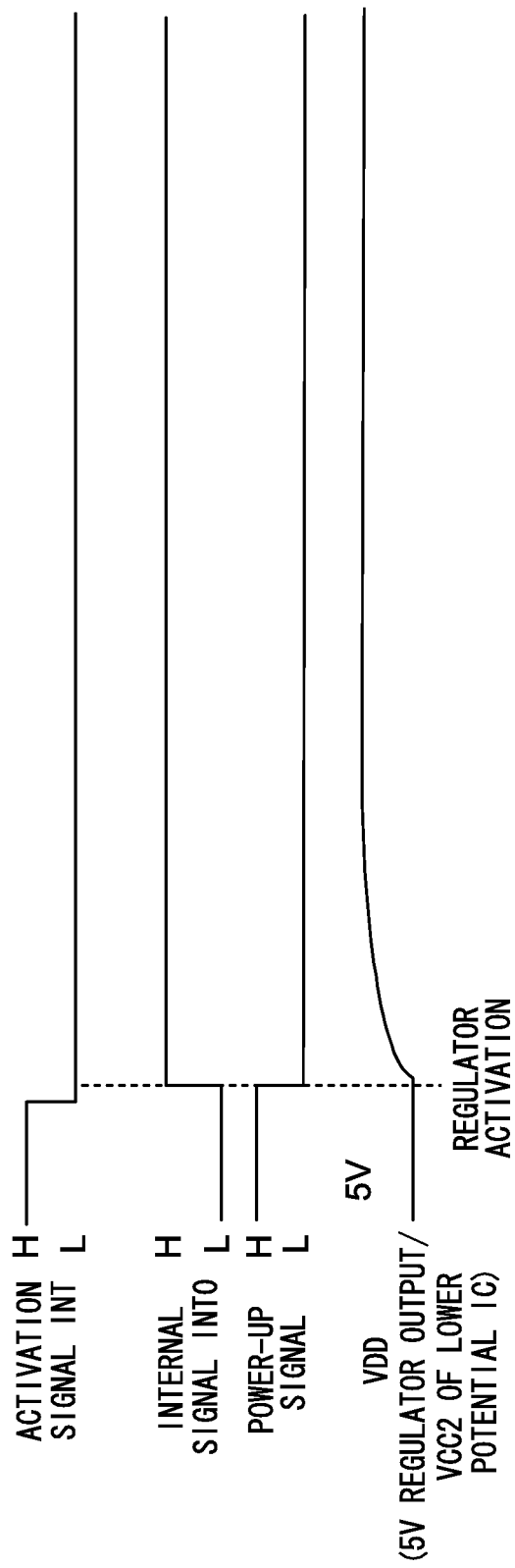
FIG. 16 is a timing chart illustrating an example of activation of a lowest potential battery monitoring IC of the second exemplary embodiment.
Figure 17:
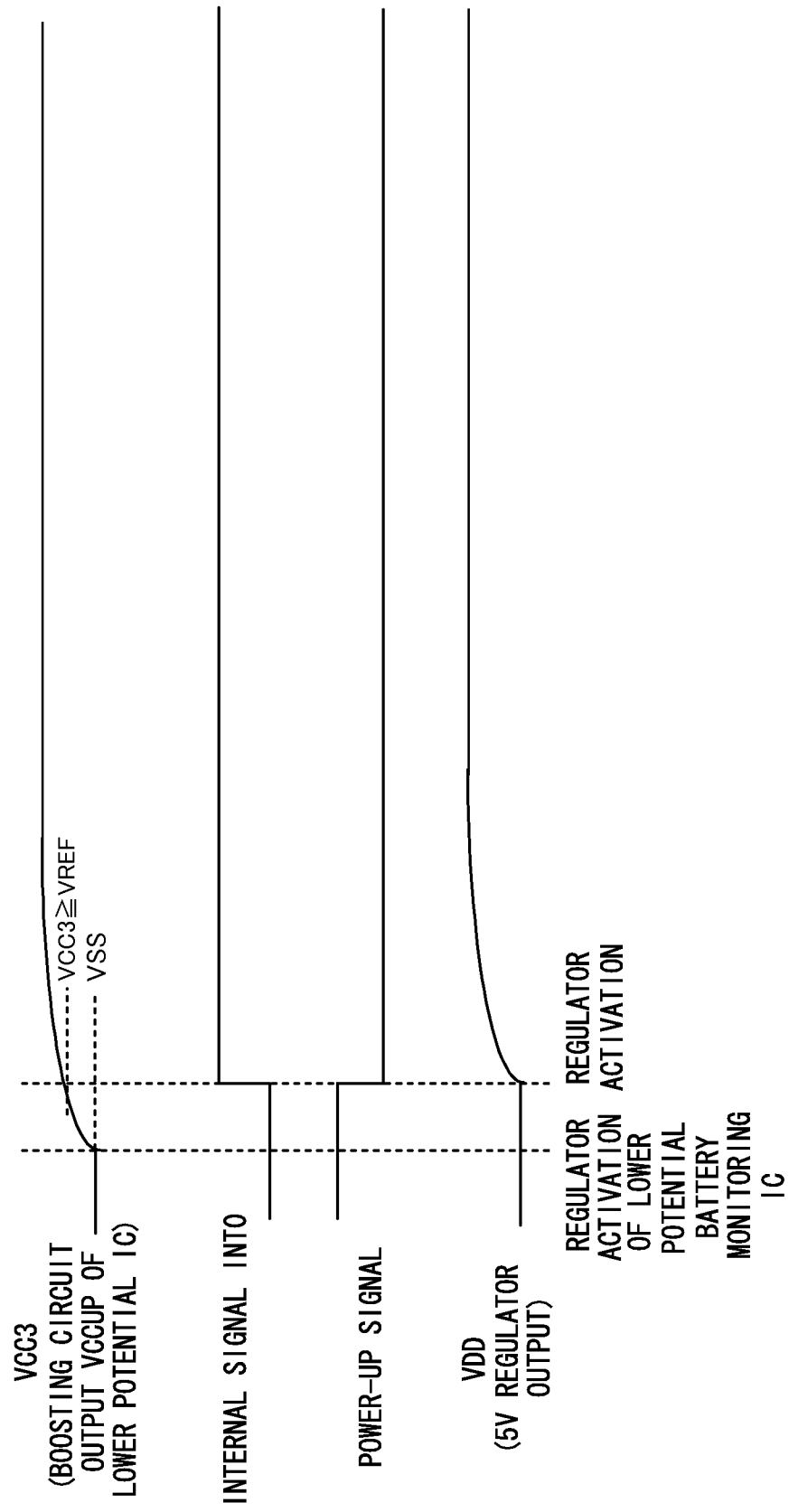
FIG. 17 is a timing chart illustrating an example of activation of battery monitoring ICs other than the lowest potential IC in the second exemplary embodiment.

FIG. 15 is a flow chart illustrating an example of flow during return from power save mode in the battery monitoring system 10. A timing chart of activation of the lowest potential battery monitoring IC $20_1$ is illustrated in FIG. 16. A timing chart of activation of the battery monitoring ICs 20 other than the lowest potential battery monitoring IC 20 is illustrated in FIG. 17.

The MCU 16 starts returning from the power save mode, as illustrated in FIG. 15, when the MCU 16 detects driving of the engine. First an activation signal INT (a transition from H level to L level) is output from the MCU 16 to the communication BLK 28 of the lowest potential battery monitoring IC $20_1$ as a command to return from the power save mode and activate the regulator 30 (step 300).

The received L level activation signal INT is input to the activation circuit 60 (the activation circuit 40A) of the battery monitoring IC $20_1$ (step 302), and an H level internal signal is output to the OR circuit 42. The OR circuit 42 outputs the H level internal signal INT0 to the RS circuit 44. Since the power down signal is at L level, the H level internal signal is output from the RS circuit 44 to the inverter INV1. An L level power-up signal (regulator activation signal) is accordingly output from the activation circuit 60 (step 304).

The regulator 30 of the battery monitoring IC $20_1$ is activated and is in a drive state when the power-up signal becomes L level, and generates the voltage electrical potential VDD (step 306). The electrical potential of the generated voltage electrical potential VDD gradually rises, as illustrated in FIG. 16. Due to supply of the generated voltage electrical potential VDD, each of the circuits of the low voltage region 22 and the low voltage region 23 are activated, and the battery monitoring IC $20_1$ is in a drive state.

Moreover, accompanying the rise in the voltage electrical potential VDD, the electrical potential of VCCUP=VCC+VDD generated in the boosting circuit 62 also gradually rises (step 307).

The output VCCUP of the boosting circuit is input as voltage electrical potential VCC3 of the higher potential (directly above) battery monitoring IC $20_2$ (step 308).

At this stage, in the activation circuit 40C of the activation circuit 60, the level of the output signal from the activation circuit 40C remains at L level without change while VCC3<VREFP1 (step 310=N). When VCC3>VREF is satisfied due to the rise in the voltage electrical potential VCCUP (step 310=Y), the H level internal signal is output from the activation circuit 40C to the OR circuit 42 (step 312). In response to the H level internal signal, the internal signal INT0 is output at H level from the OR circuit 42. Since the power down signal is L level, the H level internal signal is output from the RS circuit 44 to the inverter INV1. The L level power-up signal (regulator activation signal) is thereby output from the activation circuit 60 (step 314).

When the power-up signal is L level, the regulator 30 of the battery monitoring IC $20_2$ is activated and is in a drive state, and the voltage electrical potential VDD is generated (step 316). The electrical potential of the generated voltage electrical potential VDD gradually rises, as illustrated in FIG. 17 and similarly to the voltage electrical potential VDD of the lower potential battery monitoring IC $20_1$ described above. Due to supply of the generated voltage electrical potential VDD, each of the circuits of the low voltage region 22 and the low voltage region 23 are activated, and the battery monitoring IC $20_2$ is in a drive state.

Moreover, when the regulator 30 is activated (and the battery monitoring IC 20 also activated), the output VCCUP of the boosting circuit 62 is input as the voltage electrical potential VCC3 of the higher potential (directly above) battery monitoring IC 20 (step 318). Subsequently, in a similar manner, the output VCCUP (voltage electrical potential VCC3) of the boosting circuit 62 rises in response to the rise in voltage electrical potential VDD, and when the relationship of step 310 is satisfied, and processing of L level power-up signal output, and activation of the regulator 30 (and also activation of the battery monitoring IC 20) is performed as far as the highest potential battery monitoring IC 20. Return from power save mode is complete when the regulator 30 of the highest potential battery monitoring IC 20 (and the battery monitoring IC 20) is activated (step 399).

In the present exemplary embodiment, when returning from the power save mode, the activation signal INT at L level for activating the regulator 30 is input from the MCU 16 of the control circuit section 14 to the activation circuit 60 of the lowest potential battery monitoring IC $20_1$. In the activation circuit 40C of the activation circuit 60, an H level signal in response to the activation signal INT is output to the OR circuit 42, and a L level power-up signal is output from the activation circuit 40. The regulator 30 is activated thereby, and the battery monitoring IC $20_1$ is activated. Accompanying a rise in electrical potential of the voltage electrical potential VDD from activation of the regulator 30, the output voltage VCCUP of the boosting circuit 62=VCC+VDD=voltage electrical potential VCC3 of the higher potential battery monitoring IC 20 rises. When VCC3>VREF is satisfied, the H level internal signal from the activation circuit 40C is output to the OR circuit 42. The regulator 30 is activated thereby, and the battery monitoring IC 20 is activated. This thereby enables all of the battery monitoring ICs 20 of the battery monitoring system 10 to be activated.

As explained above, the battery monitoring ICs 20 of the battery monitoring system 10 of the exemplary embodiment described above are provided with activation circuits (activation circuits 40, 60) to control activation of the regulator 30. The activation circuit 40 and the activation circuit 60 are provided with the activation circuit 40A for outputting the L level power-up signal to activate the regulator 30 in response to the activation signal INT input from the MCU 16 of the control circuit section 14. The activation circuit 40 and the activation circuit 60 are also provided with the activation circuit 40B and the activation circuit 40C for outputting the L level power-up signal for activating the regulator 30 in response to the voltage electrical potential VDD generated by the regulator 30 of the lower potential or higher potential (the previously activated thereof) battery monitoring IC 20. Accordingly, when returning from the power save mode as described above, all of the battery monitoring ICs 20 (the regulators 30) can be activated in sequence by merely inputting the activation signal INT from the MCU 16 to one of the battery monitoring ICs 20.

Thus in the battery monitoring system 10 of the exemplary embodiments described above, in the power save mode, the regulators 30 of all of the battery monitoring ICs 20 are completely stopped, enabling the voltage electrical potential VDD of the low voltage region 22 and the low voltage region 23 that is the regulator output to be dropped to the electrical potential of voltage electrical potential VSS. The current consumption during power save mode of each of the battery monitoring ICs 20 can accordingly be made to be just the off leak of the transistors employed in the circuits, and accordingly the static current (Iccs) during power save mode can be reduced greatly.

Note that if configuration is made to transmit commands from the MCU 16 to each of the battery monitoring ICs 20, not only is separate provision of signal lines or the like required to transmit these commands, but also the configuration becomes complicated due to needing to provide a photocoupler between the MCU 16 and each of the battery monitoring ICs 20, with an issue arising of the associated cost increase. In contrast thereto, in the battery monitoring system 10 according to the first exemplary embodiment described above, the configuration can be simplified due to configuration in which a command is only transmitted from the MCU 16 to the highest potential battery monitoring IC 20, thereby enabling an increase in cost to be suppressed.

Figure 18:
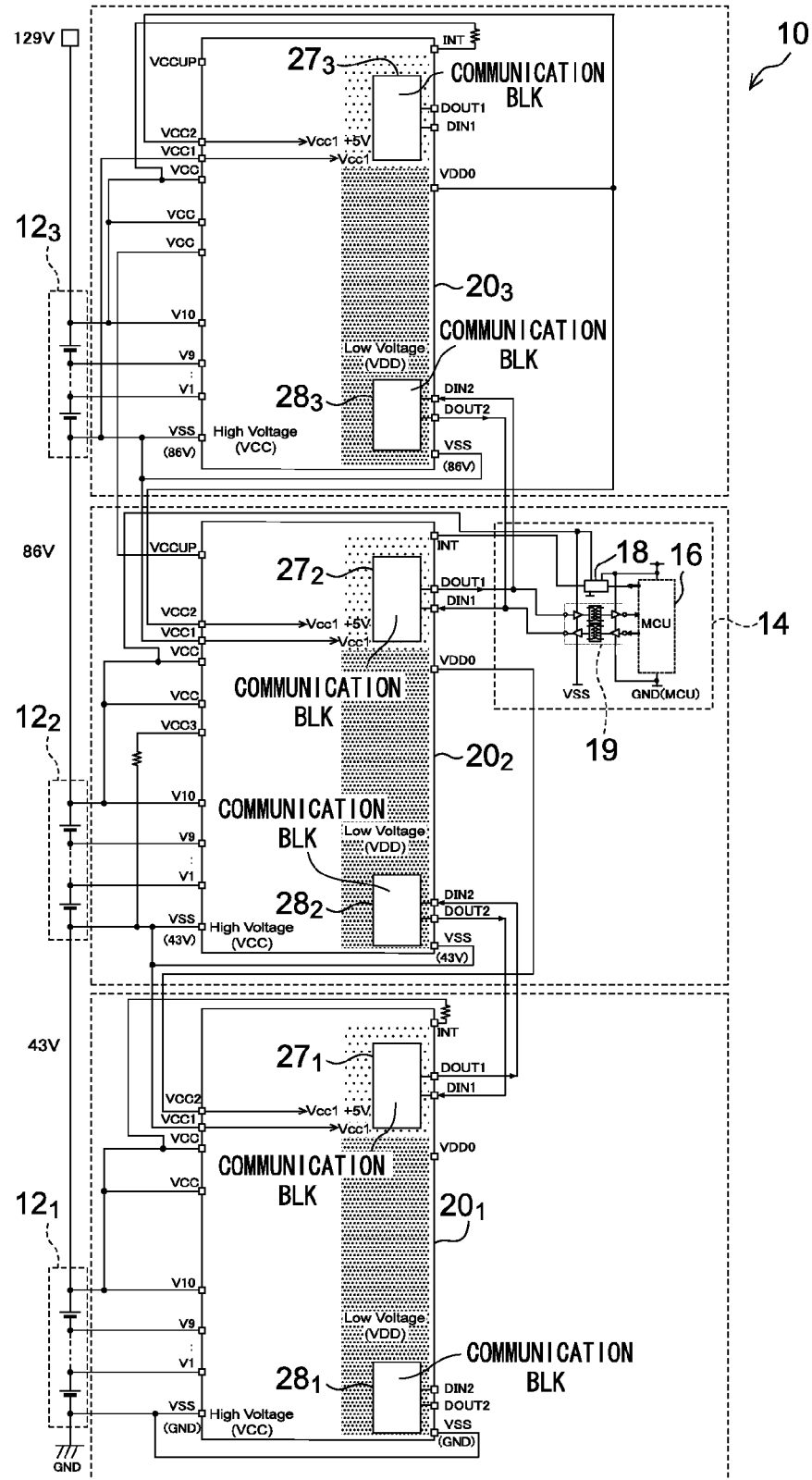
FIG. 18 is a schematic configuration diagram illustrating an example of a schematic configuration of another battery monitoring system.

Note that explanation has been given in the exemplary embodiments described above of an example in which the activation signal INT is input from the MCU 16 to the highest potential battery monitoring IC 20, and an example in which the activation signal INT is input from the MCU 16 to the lowest potential battery monitoring IC 20, however there is no limitation thereto. For example, the activation signal INT may be input from the MCU 16 to an intermediate battery monitoring IC 20 other than the highest potential or lowest potential battery monitoring ICs 20. An example of a schematic configuration of the battery monitoring system 10 in such a case is illustrated in FIG. 18. Note that such a case has characteristics from the first exemplary embodiment and the second exemplary embodiment. Moreover, combinations thereof may be employed. In any of these battery monitoring systems 10, there is no particular limitation to inputting the activation signal INT from the MCU 16. Preferably activation is performed from the highest potential battery monitoring IC 20, however design may be performed according to factors such as the specification of the battery monitoring system 10 since other cases have the following characteristics.

When activation is performed from the lowest potential battery monitoring IC 20, components such as an isolator or a photo-coupler do not need to be externally attached in order to connect to the MCU 16. However, sometimes there is a need for a boosting circuit 62 for generating a VCCUP when a boosting circuit within the battery monitoring IC 20 cannot be utilized. Thus after the regulator 30 has been activated, the boosting circuit 62 is activated, and then the VCCUP is generated, the regulator 30 of the higher potential (next) battery monitoring IC 20 is activated, and then the boosting circuit 62 is activated. Thus, since the process of activating the boosting circuit 62 is introduced between the processes of activating the regulators 30 of the battery monitoring ICs 20, it takes some time to complete activation of the battery monitoring system 10 entirely. There is moreover a concern regarding DC current (static current) flowing during power save mode in the voltage dividing circuit 56 of the activation circuit 40C of the activation circuit 40. Note that it is possible to make this static current due to operating current of the regulator 30 during operation of the regulator 30 during power save mode, or due to DC current flow, sufficiently small. The configuration of the activation circuit 40C is more complicated than that of the activation circuit 40B.

However, when performing activation from an intermediate battery monitoring IC 20, both the above features need to be provided. There is therefore a concern regarding such factors as the configuration becoming more complicated, and/or the surface area of chips becoming larger.

Moreover, explanation has been given in the exemplary embodiments described above of a case in which the activation circuit 40 is provided with the activation circuit 40A and the activation circuit 40B, and the activation circuit 60 is provided with the activation circuit 40A and the activation circuit 40C, however configuration may be made with provision only to one thereof. For example, in cases such as the first exemplary embodiment in which activation is performed from the highest potential battery monitoring IC 20, the activation circuit 40 of the highest potential battery monitoring IC 20 may have only with the activation circuit 40A, and the activation circuits 40 of the other battery monitoring ICs 20 may have only with the activation circuit 40B. In a similar manner, in cases such as the second exemplary embodiment in which activation is performed from lowest potential battery monitoring IC 20, the activation circuit 60 of the lowest potential battery monitoring IC 20 may have only the activation circuit 40A, and the activation circuit 60 of the other battery monitoring ICs 20 may have only the activation circuit 40C. Note that configuring as in the exemplary embodiments described above with the activation circuits (40, 60) which have both enables suppression of cost increases arising from differentiated manufacture of the activation circuits (40, 60).

Note that in the exemplary embodiments described above, as an example, explanation has been given of regulators 30 that activate (a drive state) when the power-up signal is at L level. However, regulators 30 may be employed that activate (a drive state) when the power-up signal is at H level. In such cases, configuration may be made with a buffer provided to the activation circuits (40, 60) in place of the inverter INV1.

Moreover, explanation has been given in the above exemplary embodiments of a case in which the activation circuits 40, 60 activate regulators 30, however circuits other than the regulator 30 may also be activated together with the regulators 30.

Moreover, the battery cells E are not limited to lithium ion secondary batteries, and other batteries may be employed therefor. Note that lithium ion secondary batteries have the characteristics of obtaining a higher energy density (higher power density) than other secondary batteries, having high battery voltage per single battery cell, having high charge-discharge energy efficiency, and moreover no memory effect. They are accordingly preferably employed in the field of hybrid vehicles, motor drive equipment and the like.

Configurations and operation of the battery monitoring system 10, the control circuit section 14, the battery monitoring ICs 20, the activation circuit 40 and the activation circuit 60 explained in the exemplary embodiments described above are also merely examples thereof, and obviously various modifications are possible within a scope not departing from of the spirit of the present invention.

Embodiments of the present invention are described above, but the present invention is not limited to the embodiments as will be clear to those skilled in the art.

What is claimed is:

1. A battery monitoring system, comprising:
   a plurality of battery monitoring devices that are serially connected to each other, that are each provided for one of a plurality of serially connected battery cell groups, and that monitor a voltage of a plurality of battery cells included in each of the plurality of battery cell groups; and
   a control circuit that is connected to one battery monitoring device of the plurality of battery monitoring devices and that transmits a first activation signal to the one battery monitoring device,
   wherein each particular one of the plurality of battery monitoring devices comprises:
   a constant voltage generation circuit that generates and outputs a constant voltage;
   a first activation circuit that outputs a second activation signal if the first activation circuit receives the first activation signal from the control circuit; and
   a second activation circuit that outputs a third activation signal in response to recognizing the constant voltage generated by the constant voltage generation of another of the battery monitoring devices that is connected to the particular battery monitoring device, and
   wherein the constant voltage generation circuit generates the constant voltage if the constant voltage generation circuit receives the second activation signal or the third activation signal.

2. The battery monitoring system of claim 1, wherein each of the plurality of battery monitoring devices includes a communication circuit for performing communication with another of the battery monitoring devices that is connected to the particular battery monitoring device, and the communication circuit is driven using the constant voltage generated by the constant voltage generation circuit.

3. The battery monitoring system of claim 1, wherein the constant voltage generation circuit of each of the plurality of the battery monitoring devices generates the constant voltage based on a voltage provided by a battery cell group which is an object to be monitored by the battery monitoring device in which the constant voltage generation circuit is formed.

4. The battery monitoring system of claim 1, wherein the second activation circuit outputs the third activation signal if the second activation circuit recognizes that the constant voltage, which is generated by the constant voltage generation circuit of the another battery monitoring device to which the particular battery monitoring device is connected, reaches a predetermined level.

5. The battery monitoring device of claim 1, wherein the second activation circuit includes a comparison circuit, the comparison circuit outputting a comparison result between a first predetermined voltage level and a voltage level corresponding to the constant voltage, which is generated by the constant voltage generation circuit of the another battery monitoring device to which the particular battery monitoring device is connected, and the second activation circuit outputs the third activation signal if a comparison result is that the voltage level corresponding to the constant voltage exceeds the first predetermined voltage level.

6. The battery monitoring device of claim 5, wherein the voltage level corresponding to the constant voltage is a voltage level in which a second predetermined voltage level is added to the constant voltage generated by the constant voltage generation circuit of the another battery monitoring device to which the particular battery monitoring device is connected.

7. A battery monitoring device that is included in a battery monitoring system, the battery monitoring system including: a plurality of battery monitoring devices that are serially connected to each other, that are each provided for one of a plurality of serially connected battery cell groups, and that monitor a voltage of a plurality of battery cells included in each of the plurality of battery cell groups; and a control circuit that is connected to one battery monitoring device of the plurality of battery monitoring devices and that transmits a first activation signal to the one battery monitoring device, each particular one of the battery monitoring devices included in the battery monitoring system comprising:
    a constant voltage generation circuit that generates and outputs a constant voltage;
    a first activation circuit that outputs a second activation signal if the first activation circuit receives the first activation signal from the control circuit; and
    a second activation circuit that outputs a third activation signal in response to recognizing the constant voltage generated by the constant voltage generation of another of the battery monitoring devices that is connected to the particular battery monitoring device, and
    wherein the constant voltage generation circuit generates the constant voltage if the constant voltage generation circuit receives the second activation signal or the third activation signal.

\* \* \* \* \*